(12) United States Patent
Rhee et al.

(10) Patent No.: US 9,093,629 B2
(45) Date of Patent: Jul. 28, 2015

(54) DISPLAY DEVICE USING SEMICONDUCTOR LIGHT EMITTING DEVICE AND METHOD OF FABRICATING THE SAME

(71) Applicant: LG ELECTRONICS INC., Seoul (KR)

(72) Inventors: Byungjoon Rhee, Seoul (KR); Kyuhyun Bang, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 0 days.

(21) Appl. No.: 14/478,599

(22) Filed: Sep. 5, 2014

(65) Prior Publication Data

US 2015/0171297 A1    Jun. 18, 2015

(30) Foreign Application Priority Data

Dec. 17, 2013    (KR) .................. 10-2013-0157568

(51) Int. Cl.
| | | |
|---|---|---|
| H01L 33/00 | (2010.01) | |
| H01L 33/62 | (2010.01) | |
| F21K 99/00 | (2010.01) | |
| H01L 33/50 | (2010.01) | |
| F21Y 101/02 | (2006.01) | |

(52) U.S. Cl.
CPC . *H01L 33/62* (2013.01); *F21K 9/50* (2013.01); *H01L 33/50* (2013.01); *F21Y 2101/02* (2013.01)

(58) Field of Classification Search
CPC ........... H01L 33/62; H01L 33/50; F21K 9/50; F21Y 2101/02
USPC .......................................................... 257/88
See application file for complete search history.

(56) References Cited

U.S. PATENT DOCUMENTS

| | | | |
|---|---|---|---|
| 2007/0290196 A1* | 12/2007 | Fischer et al. | 257/40 |
| 2008/0231789 A1* | 9/2008 | Kurasawa | 349/139 |
| 2011/0147779 A1 | 6/2011 | Kang et al. | |
| 2013/0264600 A1* | 10/2013 | Lee et al. | 257/98 |

FOREIGN PATENT DOCUMENTS

| | | |
|---|---|---|
| KR | 10-2011-0029755 A | 3/2011 |
| KR | 10-2011-0071270 A | 6/2011 |
| KR | 10-1211864 B1 | 12/2012 |
| KR | 10-2013-0087160 A | 8/2013 |

* cited by examiner

*Primary Examiner* — Victor A Mandala
(74) *Attorney, Agent, or Firm* — Birch, Stewart, Kolasch & Birch, LLP

(57) ABSTRACT

Discussed is a display device including a wiring substrate disposed with a first electrode; a conductive adhesive layer disposed between the wiring substrate and a second electrode; and a plurality of semiconductor light emitting devices coupled to the conductive adhesive layer, and electrically connected to the first electrode and the second electrode, wherein at least one of the plurality of semiconductor light emitting devices comprises a first conductive electrode and a second conductive electrode disposed to be separated from each other, the at least one of the semiconductor light emitting devices having a lateral surface, and wherein the second conductive electrode extends beyond the lateral surface of the at least one of semiconductor light emitting devices.

15 Claims, 15 Drawing Sheets

DISPLAY DEVICE USING SEMICONDUCTOR LIGHT EMITTING DEVICE AND METHOD OF FABRICATING THE SAME

CROSS-REFERENCE TO RELATED APPLICATIONS

This application claims the benefit of priority to Korean Patent Application No. 10-2013-0157568, filed on Dec. 17, 2013, the contents of which is herein expressly incorporated by reference in its entirety.

BACKGROUND OF THE INVENTION

1. Field of the Invention

The embodiment of the invention relates to a display device, and more particularly, to a display device using a semiconductor light emitting device.

2. Description of the Related Art

In recent years, display devices having excellent characteristics such as low profile, flexibility and the like have been developed in the display technical field. On the contrary, currently commercialized main displays are represented by liquid crystal displays (LCDs) and active matrix organic light emitting diodes (AMOLEDs).

However, there exist problems such as mediocre response time, difficult implementation of flexibility in case of LCDs, and there exist drawbacks such as short life span, mediocre yield as well as low flexibility in case of AMOLEDs.

On the other hand, light emitting diodes (LEDs) are well known light emitting devices for converting an electrical current to light, and have been used as a light source for displaying an image in an electronic device including information communication devices since red LEDs using GaAsP compound semiconductors were made commercially available in 1962, together with a GaP:N-based green LEDs. Accordingly, the semiconductor light emitting devices may be used to implement a flexible display, thereby presenting a scheme for solving the problems.

Furthermore, in addition to this, it may be possible to conceive the structure of further simplifying a fabrication process in a flexible display using semiconductor light emitting devices.

SUMMARY OF THE INVENTION

An aspect of the embodiment of the invention is to provide a display device capable of further simplifying a fabrication process thereof as well as providing flexibility.

Another aspect of the embodiment of the invention is to provide a display device in which a semiconductor light emitting device easily fabricated with fine pitch is implemented as a sub-pixel.

Still another aspect of the embodiment of the invention is to provide a flip chip type semiconductor light emitting device with a new structure.

In order to accomplish the foregoing task of the embodiment of the invention, a display device according to an embodiment of the invention may include a wiring substrate disposed with a first electrode; a conductive adhesive layer disposed between the wiring substrate and a second electrode; and a plurality of semiconductor light emitting devices coupled to the conductive adhesive layer, and electrically connected to the first electrode and the second electrode, at least one of the plurality of semiconductor light emitting devices comprises a first conductive electrode and a second conductive electrode disposed to be separated from each other, the at least one of the semiconductor light emitting devices having a lateral surface, and the second conductive electrode extends beyond the lateral surface of the at least one of semiconductor light emitting devices.

According to an example associated with the embodiment of the invention, each of the plurality of semiconductor light emitting devices emits at least one of red light, green light, blue light and ultraviolet light.

According to an example associated with the embodiment of the invention, a phosphor layer is formed to convert a predetermined light into at least one of red light, green light and blue light.

According to an example associated with the embodiment of the invention, the first conductive electrode and second conductive electrode are separated from each other in a first direction and have a height difference from each other in a second direction perpendicular to the first direction to be electrically connected to the first electrode and the second electrode, respectively, at positions separated in the first direction, the at least one of the plurality of semiconductor light emitting devices further comprises a first conductive semiconductor layer, a second conductive semiconductor layer and an active layer, respectively, and the first conductive electrode is formed on one surface of the first conductive semiconductor layer, and the active layer is formed between the other surface of the first conductive semiconductor layer and one surface of the second conductive semiconductor layer, and the second conductive electrode is formed on the second conductive semiconductor layer and disposed adjacent to the second electrode due to the height difference.

According to an example associated with the embodiment of the invention, the second conductive semiconductor layer has a recess portion formed in a surface of the second conductive semiconductor layer that is closest to the wiring substrate, and a portion of the second conductive electrode is accommodated into the recess portion.

According to an example associated with the embodiment of the invention, the recess portion is formed at an edge of the second conductive semiconductor layer.

According to an example associated with the embodiment of the invention, as the second conductive electrode is accommodated into the recess portion, a lower surface of the second conductive electrode is coplanar with the one surface of the second conductive semiconductor layer.

According to an example associated with the embodiment of the invention, the at least one of the plurality of semiconductor light emitting devices further comprises a first conductive semiconductor layer, a second conductive semiconductor layer and an active layer, respectively, that are stacked in one direction, and at least part of the second conductive electrode is protruded from the lateral surface of the second conductive semiconductor layer along another direction that is perpendicular to the one direction.

According to an example associated with the embodiment of the invention, the second electrode is electrically connected to a surface of a protruded portion of the second conductive electrode that extends beyond the lateral surface of the second conductive semiconductor layer.

According to an example associated with the embodiment of the invention, the second conductive electrode has an upper surface most distal from the wiring substrate, and the second electrode is electrically connected to the upper surface.

According to an example associated with the embodiment of the invention, the surface of the protruded portion of the second conductive electrode has a height difference from another surface of the second conductive semiconductor layer that is most distal from the wiring substrate.

According to an example associated with the embodiment of the invention, at least part of the second conductive electrode is embedded in the conductive adhesive layer.

According to an example associated with the embodiment of the invention, two or more of the plurality of semiconductor light emitting devices share a single second conductive electrode within a sub-pixel.

According to an example associated with the embodiment of the invention, the single second conductive electrode is formed by adjoined second conductive electrodes of the semiconductor light emitting devices within the sub-pixel that are connected to one another.

According to an example associated with the embodiment of the invention, the plurality of semiconductor light emitting devices are flip chip type light emitting devices.

In order to accomplish the foregoing task of the embodiment of the invention, a method of fabricating a display device according to an embodiment of the invention may include forming a semiconductor light emitting device having a first conductive semiconductor layer, an active layer and a second conductive semiconductor layer; removing at least part of the first conductive semiconductor layer, active layer and second conductive semiconductor layer to expose at least part of the second conductive semiconductor layer and form a groove on the second conductive semiconductor layer; forming a first conductive electrode and a second conductive electrode having a height difference in a thickness direction of the conductive adhesive layer on the first conductive semiconductor layer and the second conductive semiconductor layer, respectively, to implement a flip chip type light emitting device, the first conductive electrode and the second conductive electrode are disposed to be separated from each other, the semiconductor light emitting device has a lateral surface, and the second conductive electrode extends beyond the lateral surface of the semiconductor light emitting device; and coupling the flip chip type light emitting device to the conductive adhesive layer.

A flip chip type semiconductor light emitting device according to an embodiment of the invention may include a first conductive semiconductor layer, a second conductive semiconductor layer and an active layer, a first conductive electrode is formed on one surface of the first conductive semiconductor layer, the active layer is formed between the other surface of the first conductive semiconductor layer and one surface of the second conductive semiconductor layer, and a second conductive electrode is formed on the second conductive semiconductor layer, and the second conductive electrode extends beyond a lateral surface of the second conductive semiconductor layer, and covers at least part of the lateral surface of the second conductive semiconductor layer.

According to an example associated with the embodiment of the invention, the first conductive semiconductor layer, the second conductive semiconductor layer and the active layer are stacked in one direction, and at least part of the second conductive electrode is protruded from the lateral surface of the second conductive semiconductor layer along another direction that is perpendicular to the one direction.

According to an example associated with the embodiment of the invention, the protruded portion of the second conductive electrode has an upper surface most distal from the first conductive electrode, and the upper surface of the protruded portion of the second conductive electrode has a height difference from another surface of the second conductive semiconductor layer that is most distal from the first conductive electrode.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE EMBODIMENTS

Figure 1:
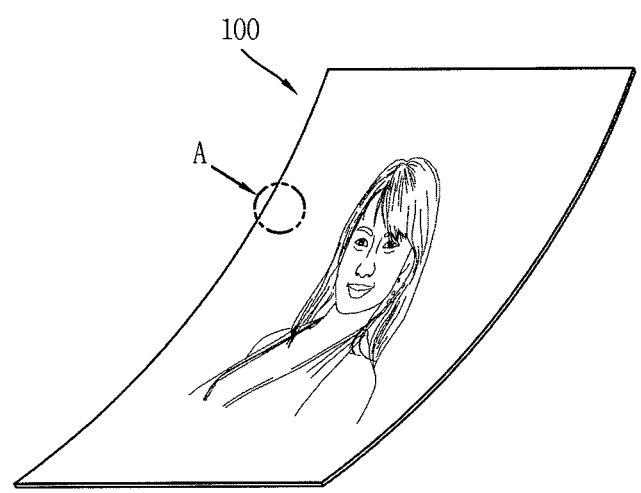
FIG. 1 is a conceptual view illustrating a display device using a semiconductor light emitting device according to an embodiment of the invention.

Hereinafter, the embodiments disclosed herein will be described in detail with reference to the accompanying drawings, and the same or similar elements are designated with the same numeral references regardless of the numerals in the drawings and their redundant description will be omitted. A suffix "module" or "unit" used for constituent elements disclosed in the following description is merely intended for easy description of the specification, and the suffix itself does not give any special meaning or function. In describing the embodiments disclosed herein, moreover, the detailed description will be omitted when a specific description for publicly known technologies to which the invention pertains is judged to obscure the gist of the present invention. Also, it should be noted that the accompanying drawings are merely illustrated to easily explain the concept of the invention, and therefore, they should not be construed to limit the technological concept disclosed herein by the accompanying drawings.

Furthermore, it will be understood that when an element such as a layer, region or substrate is referred to as being "on" another element, it can be directly on the another element or an intermediate element may also be interposed therebetween.

A display device disclosed herein may include a portable phone, a smart phone, a laptop computer, a digital broadcast terminal, a personal digital assistant (PDA), a portable multimedia player (PMP), a navigation, a slate PC, a tablet PC, an ultrabook, a digital TV, a desktop computer, and the like. However, it would be easily understood by those skilled in the art that a configuration disclosed herein may be applicable to any displayable device even though it is a new product type which will be developed later.

FIG. 1 is a conceptual view illustrating a display device using a semiconductor light emitting device according to an embodiment of the invention.

According to the drawing, information processed in the controller of the display device 100 may be displayed using a flexible display.

The flexible display may include a flexible, bendable, twistable, foldable and rollable display. For example, the flexible display may be a display fabricated on a thin and flexible substrate that can be warped, bent, folded or rolled like a paper sheet while maintaining the display characteristics of a flat display in the related art.

A display area of the flexible display becomes a plane in a configuration that the flexible display is not warped (for example, a configuration having an infinite radius of curvature, hereinafter, referred to as a "first configuration"). The display area thereof becomes a curved surface in a configuration that the flexible display is warped by an external force in the first configuration (for example, a configuration having a finite radius of curvature, hereinafter, referred to as a "second configuration"). As illustrated in the drawing, information displayed in the second configuration may be visual information displayed on a curved surface. The visual information may be implemented by individually controlling the light emission of sub-pixels disposed in a matrix form. The sub-pixel denotes a minimum unit for implementing one color.

The sub-pixel of the flexible display may be implemented by a semiconductor light emitting device. According to the embodiment of the invention, a light emitting diode (LED) is illustrated as a type of semiconductor light emitting device. The light emitting diode may be formed with a small size to perform the role of a sub-pixel even in the second configuration through this.

Hereinafter, a flexible display implemented using the light emitting diode will be described in more detail with reference to the accompanying drawings.

Figure 2:
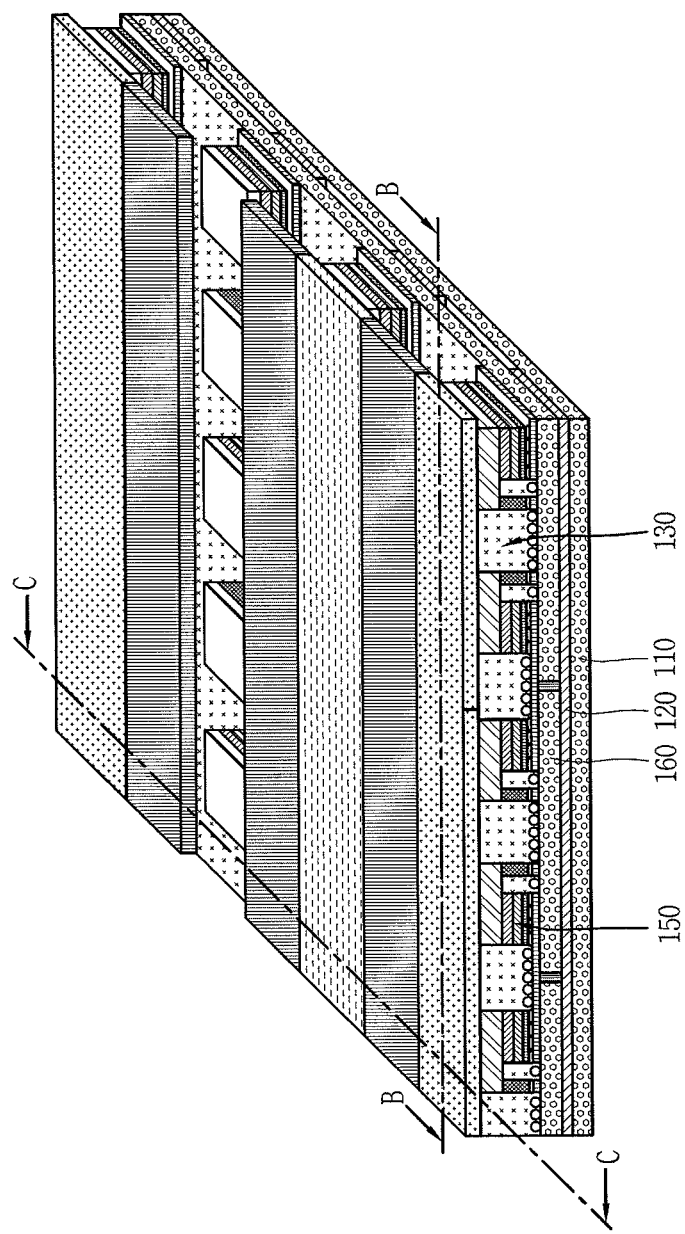
FIG. 2 is a partial enlarged view of portion "A" in FIG. 1, and FIGS. 3A and 3B are cross-sectional views taken along lines B-B and C-C in FIG. 2.
Figure 3A:
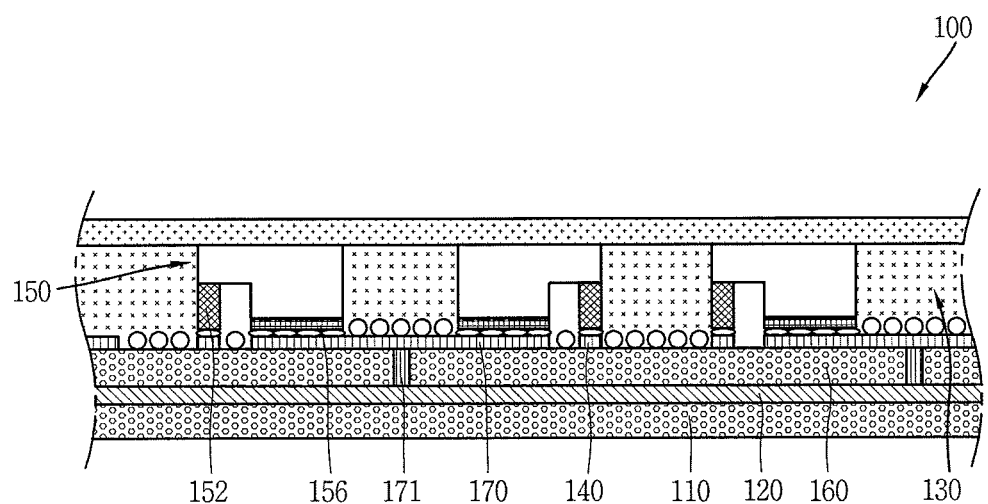
Figure 3B:
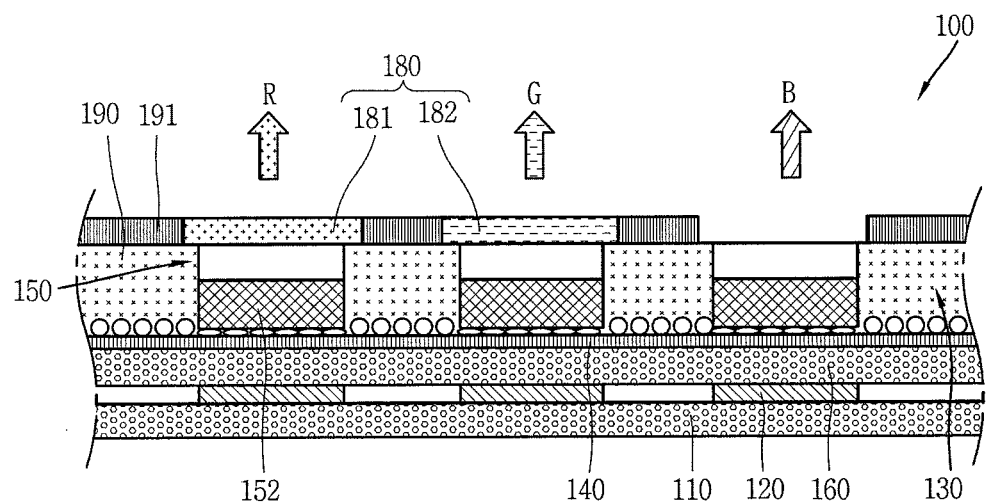
Figure 4:
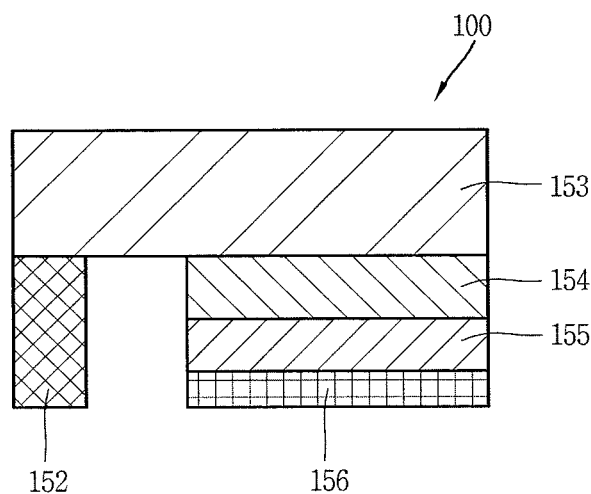
FIG. 4 is a conceptual view illustrating a flip-chip type semiconductor light emitting device in FIG. 3A.

FIG. 2 is a partial enlarged view of portion "A" in FIG. 1, and FIGS. 3A and 3B are cross-sectional views taken along lines B-B and C-C in FIG. 2, FIG. 4 is a conceptual view illustrating a flip-chip type semiconductor light emitting device in FIG. 3A, and FIGS. 5A through 5C are conceptual views illustrating various forms for implementing colors in connection with a flip-chip type semiconductor light emitting device.

According to the drawings in FIGS. 2, 3A and 3B, there is illustrated a display device 100 using a passive matrix (PM) type semiconductor light emitting device as a display device 100 using a semiconductor light emitting device. However, the following illustration may be also applicable to an active matrix (AM) type semiconductor light emitting device.

The display device 100 may include a substrate 110, a first electrode 120, a conductive adhesive layer 130, a second electrode 140, and a plurality of semiconductor light emitting devices 150.

The substrate 110 may be a flexible substrate. The substrate 110 may contain glass or polyimide (PI) to implement the flexible display device. In addition, if it is a flexible material, any one such as polyethylene naphthalate (PEN), polyethylene terephthalate (PET) or the like may be used. Furthermore, the substrate 110 may be either one of transparent and non-transparent materials.

The substrate 110 may be a wiring substrate disposed with the first electrode 120, and thus the first electrode 120 may be placed on the substrate 110.

According to the drawing, an insulating layer 160 may be disposed on the substrate 110 placed with the first electrode 120, and an auxiliary electrode 170 may be placed on the insulating layer 160. In this instance, a configuration in which the insulating layer 160 is deposited on the substrate 110 may be single wiring substrate. More specifically, the insulating layer 160 may be incorporated into the substrate 110 with an insulating and flexible material such as polyimide (PI), PET, PEN or the like to form single wiring substrate.

The auxiliary electrode 170 as an electrode for electrically connecting the first electrode 120 to the semiconductor light emitting device 150 is placed on the insulating layer 160, and disposed to correspond to the location of the first electrode 120. For example, the auxiliary electrode 170 has a dot shape, and may be electrically connected to the first electrode 120 by means of an electrode hole 171 passing through the insulating layer 160. The electrode hole 171 may be formed by filling a conductive material in a via hole.

Referring to the drawings, the conductive adhesive layer 130 may be formed on one surface of the insulating layer 160, but the embodiment of the invention may not be necessarily limited to this. For example, it may be possible to also have a structure in which the conductive adhesive layer 130 is disposed on the substrate 110 with no insulating layer 160. The conductive adhesive layer 130 may perform the role of an insulating layer in the structure in which the conductive adhesive layer 130 is disposed on the substrate 110.

The conductive adhesive layer 130 may be a layer having adhesiveness and conductivity, and to this end, a conductive material and an adhesive material may be mixed on the conductive adhesive layer 130. Furthermore, the conductive adhesive layer 130 may have flexibility, thereby allowing a flexible function in the display device.

For such an example, the conductive adhesive layer 130 may be an anisotropic conductive film (ACF), an anisotropic conductive paste, a solution containing conductive particles, and the like. The conductive adhesive layer 130 may allow electrical interconnection in the z-direction passing through the thickness thereof, but may be configured as a layer having electrical insulation in the horizontal x-y direction thereof. Accordingly, the conductive adhesive layer 130 may be referred to as a z-axis conductive layer (however, hereinafter referred to as a "conductive adhesive layer").

The anisotropic conductive film is a film with a form in which an anisotropic conductive medium is mixed with an insulating base member, and thus when heat and pressure are applied thereto, only a specific portion thereof may have conductivity by means of the anisotropic conductive medium. Hereinafter, heat and pressure are applied to the anisotropic conductive film, but other methods may be also available for the anisotropic conductive film to partially have conductivity. The methods may include applying only either one of heat and pressure thereto, UV curing, and the like.

Furthermore, the anisotropic conductive medium may be conductive balls or particles. According to the drawing, in the present embodiment, the anisotropic conductive film is a film with a form in which an anisotropic conductive medium is mixed with an insulating base member, and thus when heat and pressure are applied thereto, only a specific portion thereof may have conductivity by means of the conductive balls. The anisotropic conductive film may be in a state in which a core with a conductive material contains a plurality of particles coated by an insulating layer with a polymer material, and in this instance, it may have conductivity by means of the core while breaking an insulating layer on a portion to which heat and pressure are applied. Here, a core may be transformed to implement a layer having both surfaces to which objects contact in the thickness direction of the film.

For a more specific example, heat and pressure are applied to an anisotropic conductive film as a whole, and electrical connection in the z-axis direction is partially formed by a height difference from a mating object adhered by the use of the anisotropic conductive film.

For another example, an anisotropic conductive film may be in a state containing a plurality of particles in which a conductive material is coated on insulating cores. In this instance, a portion to which heat and pressure are applied may be converted (pressed and adhered) to a conductive material to have conductivity in the thickness direction of the film. For still another example, it may be formed to have conductivity in the thickness direction of the film in which a conductive material passes through an insulating base member in the z-direction. In this instance, the conductive material may have a pointed end portion.

According to the drawing, the anisotropic conductive film may be a fixed array anisotropic conductive film (ACF) configured with a form in which conductive balls are inserted into one surface of the insulating base member. More specifically, the insulating base member is formed of an adhesive material, and the conductive balls are intensively disposed at a bottom portion of the insulating base member, and when heat and pressure are applied thereto, the base member is modified along with the conductive balls, thereby having conductivity in the vertical direction thereof.

However, the embodiment of the invention may not be necessarily limited to this, and the anisotropic conductive film may be all allowed to have a form in which conductive balls are randomly mixed with an insulating base member or a form configured with a plurality of layers in which conductive balls are disposed at any one layer (double-ACF), and the like.

The anisotropic conductive paste as a form coupled to a paste and conductive balls may be a paste in which conductive balls are mixed with an insulating and adhesive base material. Furthermore, a solution containing conductive particles may be a solution in a form containing conductive particles or nano particles.

Referring to the drawing again, the second electrode 140 is located at the insulating layer 160 to be separated from the auxiliary electrode 170. In other words, the conductive adhesive layer 130 is disposed on the insulating layer 160 located with the auxiliary electrode 170 and second electrode 140.

When the conductive adhesive layer 130 is formed in a state that the auxiliary electrode 170 and second electrode 140 are located, and then the semiconductor light emitting device 150 is connected thereto in a flip chip form with the application of heat and pressure, the semiconductor light emitting device 150 is electrically connected to the first electrode 120 and second electrode 140.

Referring to FIG. 4, the semiconductor light emitting device may be a flip chip type semiconductor light emitting device.

For example, the semiconductor light emitting device may include a p-type electrode 156, a p-type semiconductor layer 155 formed with the p-type electrode 156, an active layer 154 formed on the p-type semiconductor layer 155, an n-type semiconductor layer 153 formed on the active layer 154, and an n-type electrode 152 disposed to be separated from the p-type electrode 156 in the horizontal direction on the n-type semiconductor layer 153. In this instance, the p-type electrode 156 may be electrically connected to a welding portion by the conductive adhesive layer 130, and the n-type electrode 152 may be electrically connected to the second electrode 140.

Referring to FIGS. 2, 3A and 3B again, the auxiliary electrode 170 may be formed in an elongated manner in one direction to be electrically connected to a plurality of semiconductor light emitting devices 150. For example, the left and right p-type electrodes of the semiconductor light emitting devices around the auxiliary electrode may be electrically connected to one auxiliary electrode.

More specifically, the semiconductor light emitting device 150 is pressed into the conductive adhesive layer 130, and through this, only a portion between the p-type electrode 156 and auxiliary electrode 170 of the semiconductor light emitting device 150 and a portion between the n-type electrode 152 and second electrode 140 of the semiconductor light emitting device 150 have conductivity, and the remaining portion does not have conductivity since there is no push-down of the semiconductor light emitting device.

Furthermore, a plurality of semiconductor light emitting devices 150 constitute a light-emitting array, and a phosphor layer 180 is formed on the light-emitting array.

The light emitting device may include a plurality of semiconductor light emitting devices with different self luminance values. Each of the semiconductor light emitting devices 150 constitutes a sub-pixel, and is electrically connected to the first electrode 120. For example, there may exist a plurality of first electrodes 120, and the semiconductor light emitting devices are arranged in several rows, for instance, and each row of the semiconductor light emitting devices may be electrically connected to any one of the plurality of first electrodes.

Furthermore, the semiconductor light emitting devices may be connected in a flip chip form, and thus semiconductor light emitting devices are grown on a transparent dielectric substrate. Furthermore, the semiconductor light emitting devices may be nitride semiconductor light emitting devices, for instance. The semiconductor light emitting device 150 has an excellent luminance characteristic, and thus it may be possible to configure individual sub-pixels even with a small size thereof.

According to the drawing, a partition wall 190 may be formed between the semiconductor light emitting devices 150. In this instance, the partition wall 190 may perform the role of dividing individual sub-pixels from one another, and be formed as an integral body with the conductive adhesive layer 130. For example, a base member of the anisotropic conductive film may form the partition wall when the semiconductor light emitting device 150 is inserted into the anisotropic conductive film.

Furthermore, when the base member of the anisotropic conductive film is black, the partition wall 190 may have reflective characteristics while at the same time increasing contrast with no additional black insulator.

For another example, a reflective partition wall may be separately provided with the partition wall 190. In this instance, the partition wall 190 may include a black or white insulator according to the purpose of the display device. It may have an effect of enhancing reflectivity when the partition wall of the while insulator is used, and increase contrast while at the same time having reflective characteristics.

The phosphor layer 180 may be located at an outer surface of the semiconductor light emitting device 150. For example, the semiconductor light emitting device 150 is a blue semiconductor light emitting device that emits blue (B) light, and the phosphor layer 180 performs the role of converting the blue (B) light into the color of a sub-pixel. The phosphor layer 180 may be a red phosphor layer 181 or green phosphor layer 182 constituting individual pixels.

In other words, a red phosphor 181 capable of converting blue light into red (R) light may be deposited on the blue semiconductor light emitting device 151 at a location implementing a red sub-pixel, and a green phosphor 182 capable of converting blue light into green (G) light may be deposited on the blue semiconductor light emitting device 151 at a location implementing a green sub-pixel. Furthermore, only the blue semiconductor light emitting device 151 may be solely used at a location implementing a blue sub-pixel. In this instance, the red (R), green (G) and blue (B) sub-pixels may implement one pixel. More specifically, one color phosphor may be deposited along each line of the first electrode 120. Accordingly, one line on the first electrode 120 may be an electrode controlling one color. In other words, red (R), green (B) and blue (B) may be sequentially disposed, thereby implementing sub-pixels.

However, the embodiment of the invention may not be necessarily limited to this, and the semiconductor light emitting device 150 may be combined with a quantum dot (QD) instead of a phosphor to implement sub-pixels such as red (R), green (G) and blue (B).

Furthermore, a black matrix 191 may be disposed between each phosphor layer to enhance contrast. In other words, the black matrix 191 can enhance the contrast of luminance.

However, the embodiment of the invention may not be necessarily limited to this, and another structure for implementing blue, red and green may be also applicable thereto.

Figure 5A:
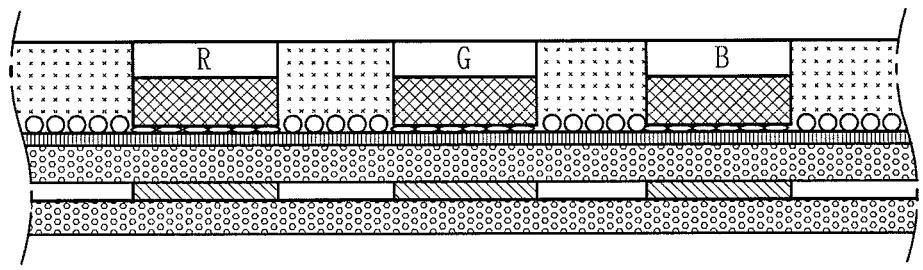
FIGS. 5A through 5C are conceptual views illustrating various forms for implementing colors in connection with a flip-chip type semiconductor light emitting device.

Referring to FIG. 5A, each of the semiconductor light emitting devices 150 may be implemented with a high-power light emitting device that emits various lights including blue in which gallium nitride (GaN) is mostly used, and indium (In) and or aluminum (Al) are added thereto.

In this instance, the semiconductor light emitting device 150 may be red, green and blue semiconductor light emitting devices, respectively, to implement each sub-pixel. For instance, red, green and blue semiconductor light emitting devices (R, G, B) are alternately disposed, and red, green and blue sub-pixels implement one pixel by means of the red, green and blue semiconductor light emitting devices, thereby implementing a full color display.

Figure 5B:
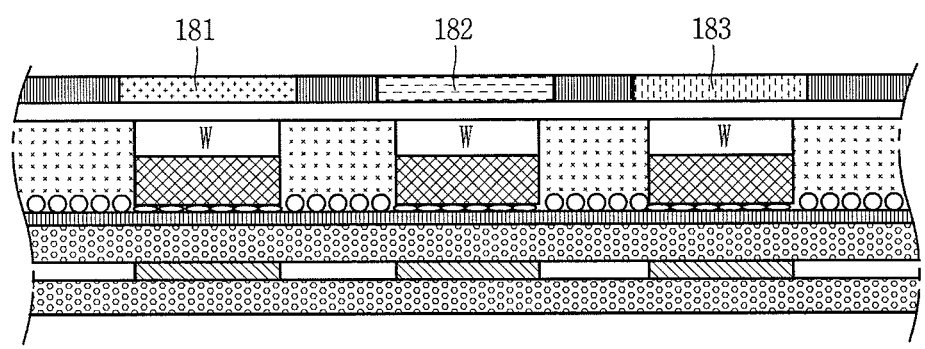

Referring to FIG. 5B, the semiconductor light emitting device may have a white light emitting device (W) provided with a yellow phosphor layer for each element. In this instance, a red phosphor layer 181, a green phosphor layer 182 and blue phosphor layer 183 may be provided on the white light emitting device (W) to implement a sub-pixel. Furthermore, a color filter repeated with red, green and blue on the white light emitting device (W) may be used to implement a sub-pixel.

Figure 5C:
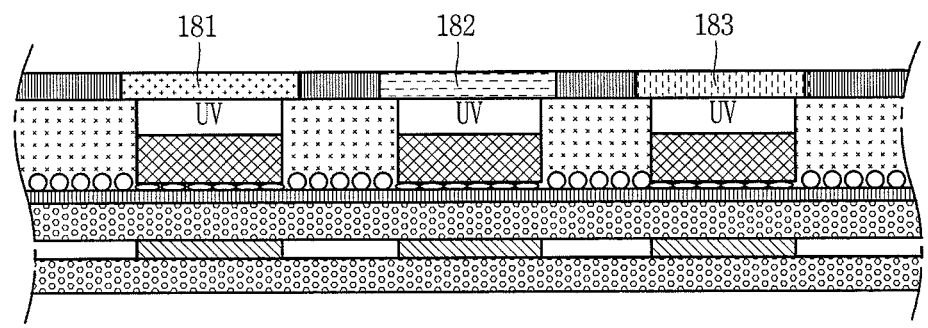

Referring to FIG. 5C, it may be possible to also have a structure in which a red phosphor layer 181, a green phosphor layer 182 and blue phosphor layer 183 may be provided on a ultra violet light emitting device (UV). In this manner, the semiconductor light emitting device can be used over the entire region up to ultra violet (UV) as well as visible light, and may be extended to a form of semiconductor light emitting device in which ultra violet (UV) can be used as an excitation source.

Taking the present example into consideration again, the semiconductor light emitting device 150 is placed on the conductive adhesive layer 130 to configure a sub-pixel in the display device. The semiconductor light emitting device 150 may have excellent luminance characteristics, and thus it may be possible to configure individual sub-pixels even with a small size thereof. The size of the individual semiconductor light emitting device 150 may be less than 80 μm in the length of one side thereof, and formed with a rectangular or square shaped element. In case of a rectangular shaped element, the size thereof may be less than 20×80 μm.

Furthermore, even when a square shaped semiconductor light emitting device 150 with a length of side of 10 μm is used for a sub-pixel, it will exhibit a sufficient brightness for implementing a display device. Accordingly, for example, in case of a rectangular pixel in which one side of a sub-pixel is 600 μm in size, and the remaining one side thereof is 300 μm, a relative distance between the semiconductor light emitting devices becomes sufficiently large. Accordingly, in this instance, it may be possible to implement a flexible display device having a HD image quality.

A display device using the foregoing semiconductor light emitting device will be fabricated by a new type of fabrication method. Hereinafter, the fabrication method will be described with reference to FIG. 6.

Figure 6:
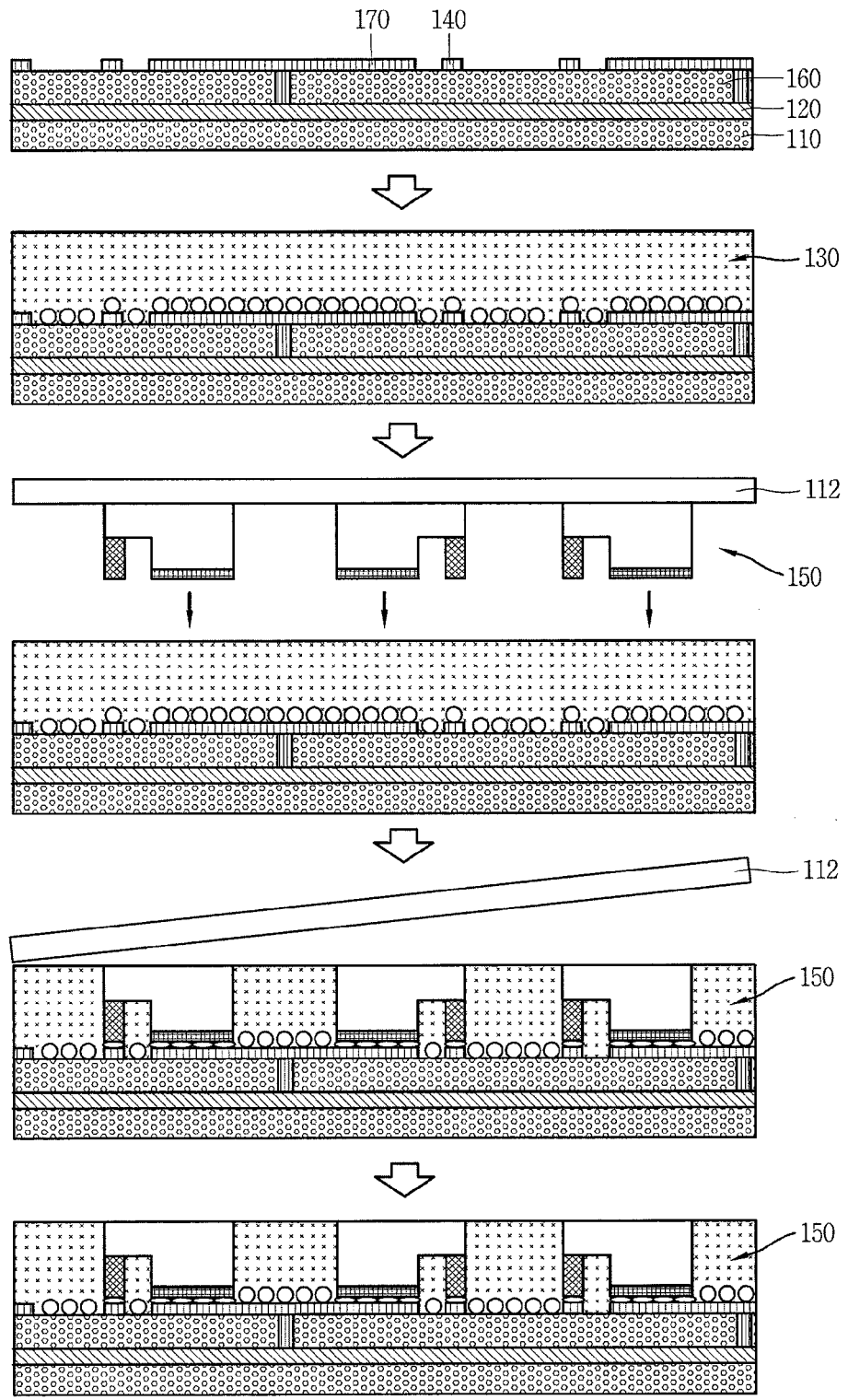
FIG. 6 is cross-sectional views illustrating a method of fabricating a display device using a semiconductor light emitting device according to the embodiment of the invention.

FIG. 6 is cross-sectional views illustrating a method of fabricating a display device using a semiconductor light emitting device according to the embodiment of the invention.

Referring to the drawing, first, the conductive adhesive layer 130 is formed on the insulating layer 160 located with the auxiliary electrode 170 and second electrode 140. The insulating layer 160 is deposited on the first substrate 110 to form one substrate (or wiring substrate), and the first electrode 120, auxiliary electrode 170 and second electrode 140 are disposed at the wiring substrate. In this instance, the first electrode 120 and second electrode 140 may be disposed in a perpendicular direction to each other. Furthermore, the first substrate 110 and insulating layer 160 may contain glass or polyimide (PI), respectively, to implement a flexible display device.

The conductive adhesive layer 130 may be implemented by an anisotropic conductive film, for example, and to this end, an anisotropic conductive film may be coated on a substrate located with the insulating layer 160.

Next, a second substrate 112 located with a plurality of semiconductor light emitting devices 150 corresponding to the location of the auxiliary electrodes 170 and second electrodes 140 and constituting individual pixels is disposed such that the semiconductor light emitting device 150 faces the auxiliary electrode 170 and second electrode 140.

In this instance, the second substrate 112 as a growth substrate for growing the semiconductor light emitting device 150 may be a sapphire substrate or silicon substrate.

The semiconductor light emitting device may have a gap and size capable of implementing a display device when formed in the unit of wafer, and thus effectively used for a display device.

Next, the wiring substrate is thermally compressed to the second substrate 112. For example, the wiring substrate and second substrate 112 may be thermally compressed to each other by applying an ACF press head. The wiring substrate and second substrate 112 are bonded to each other using the thermal compression. Only a portion between the semiconductor light emitting device 150 and the auxiliary electrode 170 and second electrode 140 may have conductivity due to the characteristics of an anisotropic conductive film having conductivity by thermal compression, thereby allowing the electrodes and semiconductor light emitting device 150 to be electrically connected to each other. At this time, the semiconductor light emitting device 150 may be inserted into the anisotropic conductive film, thereby forming a partition wall between the semiconductor light emitting devices 150.

Next, the second substrate 112 is removed. For example, the second substrate 112 may be removed using a laser lift-off (LLO) or chemical lift-off (CLO) method.

Finally, the second substrate 112 is removed to expose the semiconductor light emitting devices 150 to the outside. Silicon oxide (SiOx) or the like may be coated on the wiring substrate coupled to the semiconductor light emitting device 150 to form a transparent insulating layer.

Furthermore, it may further include the process of forming a phosphor layer on one surface of the semiconductor light emitting device 150. For example, the semiconductor light emitting device 150 may be a blue semiconductor light emitting device for emitting blue (B) light, and red or green phosphor for converting the blue (B) light into the color of the sub-pixel may form a layer on one surface of the blue semiconductor light emitting device.

The fabrication method or structure of a display device using the foregoing semiconductor light emitting device may be modified in various forms. For such an example, the foregoing display device may be applicable to a vertical semiconductor light emitting device. Hereinafter, the vertical structure will be described with reference to FIGS. 5 and 6.

Furthermore, according to the following modified example or embodiment, the same or similar reference numerals are designated to the same or similar configurations to the foregoing example, and the description thereof will be substituted by the earlier description.

Figure 7:
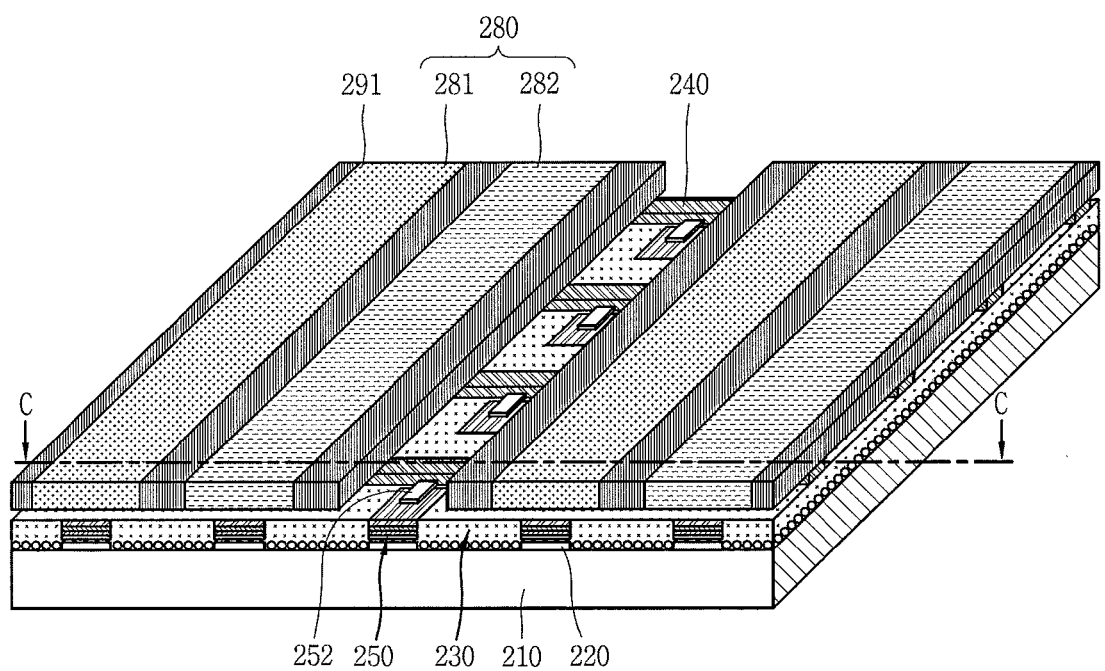
FIG. 7 is a perspective view illustrating a display device using a semiconductor light emitting device according to another embodiment of the invention.
Figure 8:
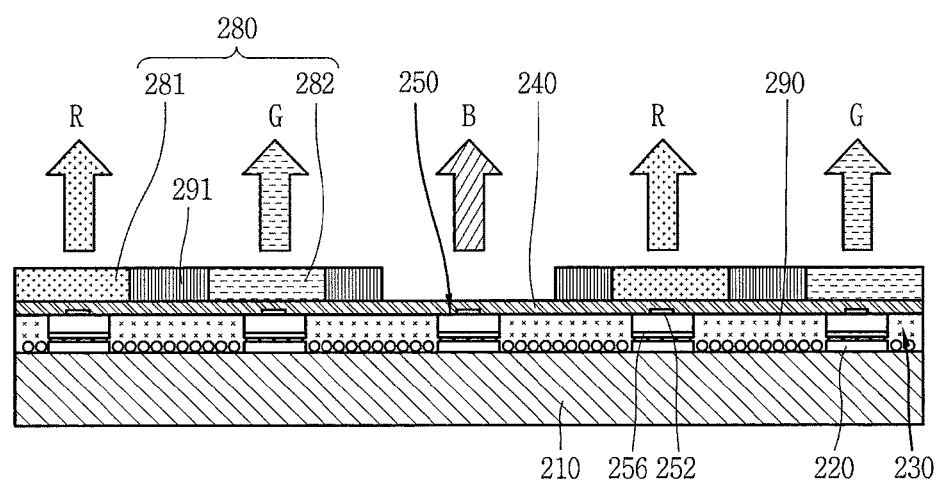
FIG. 8 is a cross-sectional view taken along line C-C in FIG. 7.
Figure 9:
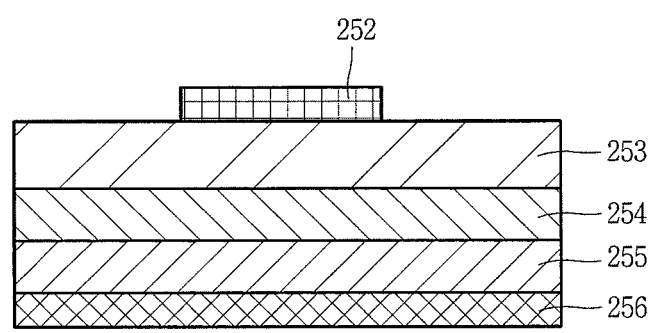
FIG. 9 is a conceptual view illustrating a vertical type semiconductor light emitting device in FIG. 8.

FIG. 7 is a perspective view illustrating a display device using a semiconductor light emitting device according to another embodiment of the invention. FIG. 8 is a cross-sectional view taken along line C-C in FIG. 7, and FIG. 9 is a conceptual view illustrating a vertical type semiconductor light emitting device in FIG. 8.

According to the drawings, the display device may be display device using a passive matrix (PM) type of vertical semiconductor light emitting device.

The display device may include a substrate 210, a first electrode 220, a conductive adhesive layer 230, a second electrode 240 and a plurality of semiconductor light emitting devices 250.

The substrate 210 as a wiring substrate disposed with the first electrode 220 may include polyimide (PI) to implement a flexible display device. In addition, any one may be used if it is an insulating and flexible material.

The first electrode 220 may be located on the substrate 210, and formed with an electrode having a bar elongated in one direction. The first electrode 220 may be formed to perform the role of a data electrode.

The conductive adhesive layer 230 is formed on the substrate 210 located with the first electrode 220. Similarly to a display device to which a flip chip type light emitting device is applied, the conductive adhesive layer 230 may be an anisotropic conductive film (ACF), an anisotropic conductive paste, a solution containing conductive particles, and the like. However, the present embodiment illustrates a case where the conductive adhesive layer 230 is implemented by an anisotropic conductive film.

When an anisotropic conductive film is located in a state that the first electrode 220 is located on the substrate 210, and then heat and pressure are applied to connect the semiconductor light emitting device 250 thereto, the semiconductor light emitting device 250 is electrically connected to the first electrode 220. At this time, the semiconductor light emitting device 250 may be preferably disposed on the first electrode 220.

The electrical connection is generated because an anisotropic conductive film partially has conductivity in the thickness direction when heat and pressure are applied as described above. Accordingly, the anisotropic conductive film is partitioned into a portion 231 having conductivity and a portion 232 having no conductivity in the thickness direction thereof.

Furthermore, the anisotropic conductive film contains an adhesive component, and thus the conductive adhesive layer 230 implements a mechanical coupling as well as an electrical coupling between the semiconductor light emitting device 250 and the first electrode 220.

In this manner, the semiconductor light emitting device 250 is placed on the conductive adhesive layer 230, thereby configuring a separate sub-pixel in the display device. The semiconductor light emitting device 250 may have excellent luminance characteristics, and thus it may be possible to configure individual sub-pixels even with a small size thereof. The size of the individual semiconductor light emitting device 250 may be less than 80 µm in the length of one side thereof, and formed with a rectangular or square shaped element. In case of a rectangular shaped element, the size thereof may be less than 20×80 µm.

The semiconductor light emitting device 250 may be a vertical structure.

A plurality of second electrodes 240 disposed in a direction crossed with the length direction of the first electrode 220, and electrically connected to the vertical semiconductor light emitting device 250 may be located between vertical semiconductor light emitting devices.

Referring to FIG. 9, the vertical semiconductor light emitting device may include a p-type electrode 256, a p-type semiconductor layer 255 formed with the p-type electrode 256, an active layer 254 formed on the p-type semiconductor layer 255, an n-type semiconductor layer 253 formed on the active layer 254, and an n-type electrode 252 formed on the n-type semiconductor layer 253. In this instance, the p-type electrode 256 located at the bottom thereof may be electrically connected to the first electrode 220 by the conductive adhesive layer 230, and the n-type electrode 252 located at the top thereof may be electrically connected to the second electrode 240 which will be described later. The electrodes may be disposed in the upward/downward direction in the vertical semiconductor light emitting device 250, thereby providing a great advantage capable of reducing the chip size.

Referring to FIG. 8 again, a phosphor layer 280 may be formed on one surface of the semiconductor light emitting device 250. For example, the semiconductor light emitting device 250 is a blue semiconductor light emitting device 251 that emits blue (B) light, and the phosphor layer 280 for converting the blue (B) light into the color of the sub-pixel may be provided thereon. In this instance, the phosphor layer 280 may be a red phosphor 281 and a green phosphor 282 constituting individual pixels.

In other words, a red phosphor 281 capable of converting blue light into red (R) light may be deposited on the blue semiconductor light emitting device 251 at a location implementing a red sub-pixel, and a green phosphor 282 capable of converting blue light into green (G) light may be deposited on the blue semiconductor light emitting device 251 at a location implementing a green sub-pixel. Furthermore, only the blue semiconductor light emitting device 251 may be solely used at a location implementing a blue sub-pixel. In this instance, the red (R), green (G) and blue (B) sub-pixels may implement one pixel.

However, the embodiment of the invention may not be necessarily limited to this, and another structure for implementing blue, red and green may be also applicable thereto as described above in a display device to which a flip chip type light emitting device is applied.

Taking the present embodiment into consideration again, the second electrode 240 is located between the semiconductor light emitting devices 250, and electrically connected to the semiconductor light emitting devices 250. For example, the semiconductor light emitting devices 250 may be disposed in a plurality of rows, and the second electrode 240 may be located between the rows of the semiconductor light emitting devices 250.

Since a distance between the semiconductor light emitting devices 250 constituting individual pixels is sufficiently large, the second electrode 240 may be located between the semiconductor light emitting devices 250.

The second electrode 240 may be formed with an electrode having a bar elongated in one direction, and disposed in a perpendicular direction to the first electrode.

Furthermore, the second electrode 240 may be electrically connected to the semiconductor light emitting device 250 by a connecting electrode protruded from the second electrode 240. More specifically, the connecting electrode may be an n-type electrode of the semiconductor light emitting device 250. For example, the n-type electrode is formed with an ohmic electrode for ohmic contact, and the second electrode covers at least part of the ohmic electrode by printing or deposition. Through this, the second electrode 240 may be electrically connected to the n-type electrode of the semiconductor light emitting device 250.

According to the drawing, the second electrode 240 may be located on the conductive adhesive layer 230. According to circumstances, a transparent insulating layer containing silicon oxide (SiOx) may be formed on the substrate 210 formed with the semiconductor light emitting device 250. When the transparent insulating layer is formed and then the second electrode 240 is placed thereon, the second electrode 240 may be located on the transparent insulating layer. Furthermore, the second electrode 240 may be formed to be separated from the conductive adhesive layer 230 or transparent insulating layer.

If a transparent electrode such as indium tin oxide (ITO) is used to locate the second electrode 240 on the semiconductor light emitting device 250, the ITO material has a problem of bad adhesiveness with an n-type semiconductor. Accordingly, the second electrode 240 may be placed between the semiconductor light emitting devices 250, thereby obtaining an advantage in which the transparent electrode is not required. Accordingly, an n-type semiconductor layer and a conductive material having a good adhesiveness may be used as a horizontal electrode without being restricted by the selection of a transparent material, thereby enhancing the light extraction efficiency.

According to the drawing, a partition wall 290 may be formed between the semiconductor light emitting devices 250. In other words, the partition wall 290 may be disposed between the vertical semiconductor light emitting devices 250 to isolate the semiconductor light emitting device 250 constituting individual pixels. In this instance, the partition wall 290 may perform the role of dividing individual sub-pixels from one another, and be formed as an integral body with the conductive adhesive layer 230. For example, a base member of the anisotropic conductive film may form the partition wall when the semiconductor light emitting device 250 is inserted into the anisotropic conductive film.

Furthermore, when the base member of the anisotropic conductive film is black, the partition wall 290 may have reflective characteristics while at the same time increasing contrast with no additional black insulator.

For another example, a reflective partition wall may be separately provided with the partition wall 290. In this instance, the partition wall 290 may include a black or white insulator according to the purpose of the display device.

If the second electrode 240 is precisely located on the conductive adhesive layer 230 between the semiconductor light emitting devices 250, the partition wall 290 may be located between the semiconductor light emitting device 250 and second electrode 240. Accordingly, individual sub-pixels may be configured even with a small size using the semiconductor light emitting device 250, and a distance between the semiconductor light emitting devices 250 may be relatively sufficiently large to place the second electrode 240 between the semiconductor light emitting devices 250, thereby having the effect of implementing a flexible display device having a HD image quality.

Furthermore, according to the drawing, a black matrix 291 may be disposed between each phosphor layer to enhance contrast. In other words, the black matrix 191 can enhance the contrast of luminance.

As described above, the semiconductor light emitting device 250 is located on the conductive adhesive layer 230, thereby constituting individual pixels on the display device. Since the semiconductor light emitting device 250 has excellent luminance characteristics, thereby configuring individual sub-pixels even with a small size thereof. As a result, it may be possible to implement a full color display in which the sub-pixels of red (R), green (G) and blue (B) implement one pixel by means of the semiconductor light emitting device.

According to a display device using a semiconductor light emitting device according to the embodiment of the invention as described above, it may be difficult to implement a fine pitch since a first and a second electrode are arranged on the same plane when a flip chip type is applied thereto, and it may have a problem in which an etching process and a vacuum process are accompanied therewith for electrode ohmic formation when a vertical type semiconductor light emitting device is applied thereto. According to the embodiment of the invention, there is proposed a flip chip type semiconductor light emitting device with a new form to solve the foregoing problem. Hereinafter, a display device to which a flip chip type semiconductor light emitting device with a new form is applied will be described in more detail.

Figure 10:
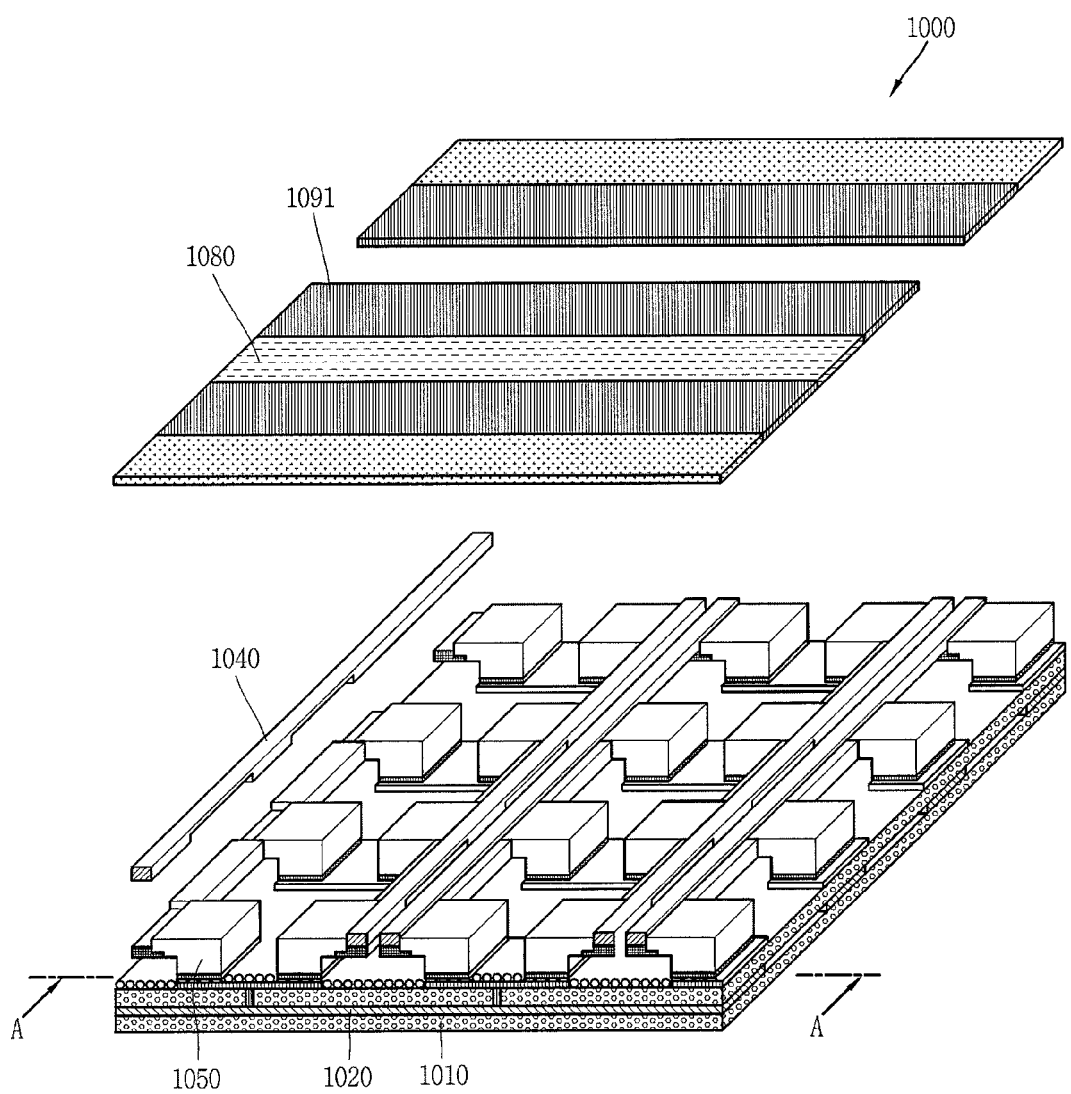
FIG. 10 is a partially enlarged view illustrating a display device to which a semiconductor light emitting device with a new structure is applied.
Figure 11A:
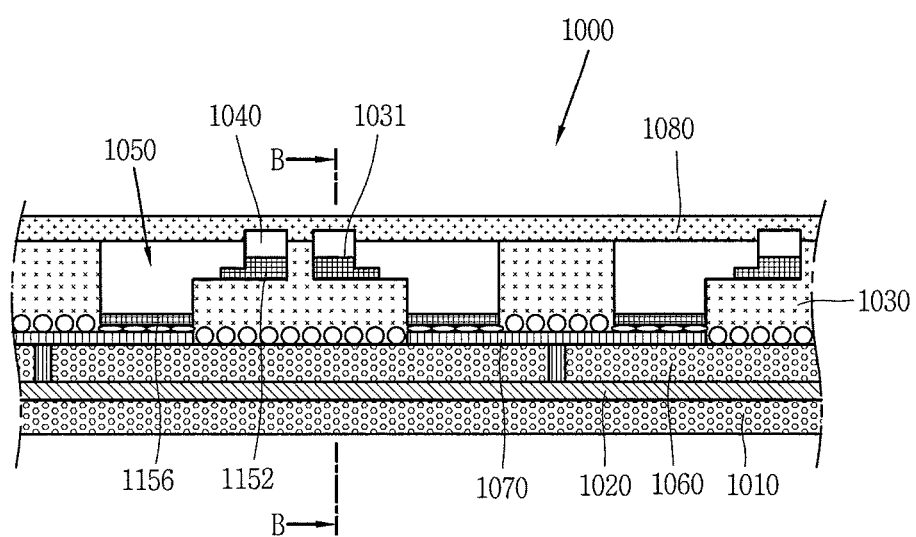
FIG. 11A is a cross-sectional view taken along line A-A.
Figure 11B:
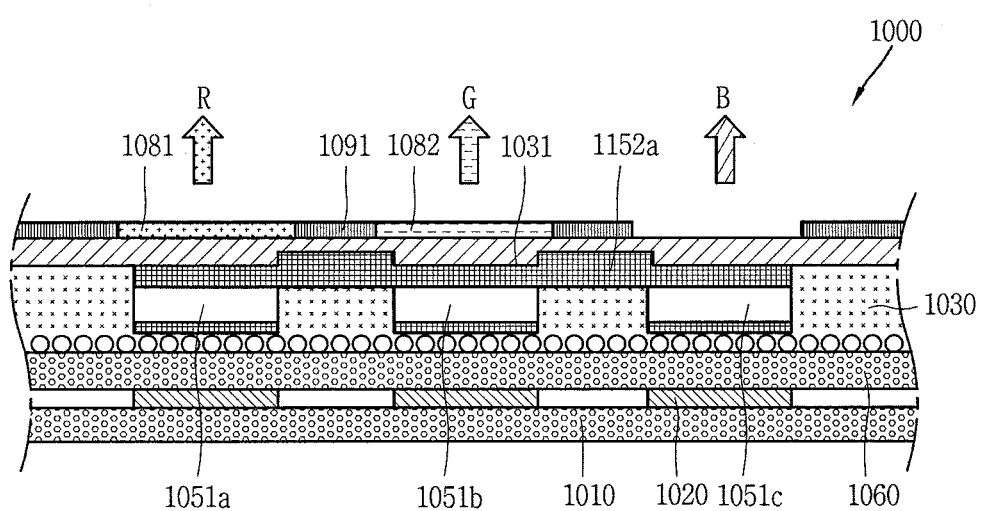
FIG. 11B is a cross-sectional view taken along line B-B.
Figure 12:
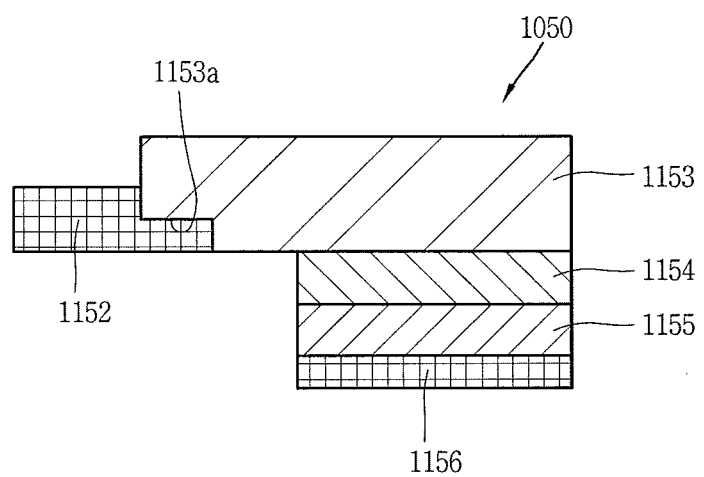
FIG. 12 is a conceptual view illustrating a flip chip type semiconductor light emitting device in FIG. 11A.

FIG. 10 is a partially enlarged view illustrating a display device to which a semiconductor light emitting device with a new structure is applied, and FIG. 11A is a cross-sectional view taken along line A-A, and FIG. 11B is a cross-sectional view taken along line B-B, and FIG. 12 is a conceptual view illustrating a flip chip type semiconductor light emitting device in FIG. 11A.

Referring to FIGS. 10, 11A and 11B, there is illustrated a display device 100 using a passive matrix (PM) type semiconductor light emitting device as a display device 1000 using a semiconductor light emitting device. However, the following illustration may be also applicable to an active matrix (AM) type semiconductor light emitting device.

The display device 1000 may include a substrate 1010, a first electrode 1020, a conductive adhesive layer 1030, a second electrode 1040, and a plurality of semiconductor light emitting devices 1050. Here, the first electrode 1020 and second electrode 1040 may include a plurality of electrode lines, respectively.

The substrate 1010 as a wiring substrate on which the first electrode 1020 is disposed may include polyimide (PI) to implement a flexible display device. In addition, any one may be used if it is an insulating and flexible material.

The first electrode 1020 may be located on the substrate 1010, and formed with an electrode having a bar elongated in one direction. The first electrode 1020 may be formed to perform the role of a data electrode.

The conductive adhesive layer 1030 is formed on the substrate 1010 located with the first electrode 1020. Similarly to a display device to which a flip chip type light emitting device is applied, the conductive adhesive layer 1030 may be an anisotropic conductive film (ACF), an anisotropic conductive paste, a solution containing conductive particles, and the like. However, the present embodiment illustrates a case where the conductive adhesive layer 1030 is implemented by an anisotropic conductive film.

When an anisotropic conductive film is located in a state that the first electrode 1020 is located on the substrate 1010, and then heat and pressure are applied to connect the semiconductor light emitting device 1050 thereto, the semiconductor light emitting device 1050 is electrically connected to the first electrode 1020. At this time, the semiconductor light emitting device 1050 may be preferably disposed on the first electrode 1020.

The electrical connection is generated because an anisotropic conductive film partially has conductivity in the thickness direction when heat and pressure are applied as described above. Accordingly, the anisotropic conductive film is partitioned into a portion having conductivity and a portion having no conductivity in the thickness direction thereof.

Furthermore, the anisotropic conductive film contains an adhesive component, and thus the conductive adhesive layer 1030 implements a mechanical coupling as well as an electrical coupling between the semiconductor light emitting device 1050 and the first electrode 1020.

A plurality of second electrodes 1040 disposed in a direction crossed with the length direction of the first electrode 1020, and electrically connected to the semiconductor light emitting device 1050 may be located between the semiconductor light emitting devices.

According to the drawing, the second electrode 1040 may be located on the conductive adhesive layer 1030. In other words, the conductive adhesive layer 1030 is disposed between the wiring substrate and the second electrode 1040. The second electrode 1040 may be electrically connected thereto due to a contact with the semiconductor light emitting device 1050.

Due to the foregoing structure, the plurality of semiconductor light emitting devices 1050 are coupled to the conductive adhesive layer 1030, and electrically connected to the first electrode 1020 and second electrode 1040.

According to circumstances, a transparent insulating layer containing silicon oxide (SiOx) may be formed on the substrate 1010 formed with the semiconductor light emitting device 1050. When the transparent insulating layer is formed and then the second electrode 1040 is placed thereon, the second electrode 1040 may be located on the transparent insulating layer. Furthermore, the second electrode 1040 may be formed to be separated from the conductive adhesive layer 1030 or transparent insulating layer.

As illustrated in the drawing, the plurality of semiconductor light emitting devices 1050 may form a plurality of columns in a direction in parallel to a plurality of electrode lines provided in the first electrode 1020. However, the embodiment of the invention may not be necessarily limited to this. For example, the plurality of semiconductor light emitting devices 1050 may form a plurality of columns along the second electrode 1040.

Moreover, the display device 1000 may further include a phosphor layer 1080 formed on one surface of the plurality of semiconductor light emitting devices 1050. For example, the semiconductor light emitting device 1050 is a blue semiconductor light emitting device that emits blue (B) light, and the phosphor layer 1080 performs the role of converting the blue (B) light into the color of a sub-pixel. The phosphor layer 1080 may be a red phosphor layer 1081 or green phosphor layer 1082 constituting individual pixels. In other words, a red phosphor 1081 capable of converting blue light into red (R) light may be deposited on the blue semiconductor light emitting device 1051a at a location implementing a red sub-pixel, and a green phosphor 1082 capable of converting blue light into green (G) light may be deposited on the blue semiconductor light emitting device 1051b at a location implementing a green sub-pixel. Furthermore, only the blue semiconductor light emitting device 1051c may be solely used at a location implementing a blue sub-pixel. In this instance, the red (R), green (G) and blue (B) sub-pixels may implement one pixel. More specifically, one color phosphor may be deposited along each line of the first electrode 1020. Accordingly, one line on the first electrode 1020 may be an electrode controlling one color. In other words, red (R), green (B) and blue (B) may be sequentially disposed along the second electrode 1040, thereby implementing sub-pixels. However, the embodiment of the invention may not be necessarily limited to this, and the semiconductor light emitting device 1050 may be combined with a quantum dot (QD) instead of a phosphor to implement sub-pixels such as red (R), green (G) and blue (B).

On the other hand, the display device may further include a black matrix 1091 disposed between each phosphor to enhance the contrast of the phosphor layer 1080. The black matrix 1091 may be formed in such a manner that a gap is made between phosphor dots, and a black material fills into the gap. Through this, the black matrix 1091 may enhance the contrast between light and shade while at the same time absorbing external light reflection. The black matrix 1091 is located between each phosphor along the first electrode 1020 in a direction on which the phosphor layer 1080 is deposited. In this instance, a phosphor layer is not formed at a location corresponding to the blue semiconductor light emitting device 1051, but black matrices may be formed at both sides by interposing a space with no the phosphor layer therebetween (or interposing the blue semiconductor light emitting device 1051c therebetween).

Referring to the semiconductor light emitting device 1050 according to the embodiment of the invention again, for the semiconductor light emitting device 1050 in the present illustration, electrodes are disposed at the top/bottom, thereby having an advantage of reducing the chip size. However, the electrodes are disposed at both the top/bottom, but a semiconductor light emitting device according to the embodiment of the invention may be a flip chip type light emitting device. Here, the structure of such a new semiconductor light emitting device will be described in detail.

Referring to FIG. 12, for example, the semiconductor light emitting device 1050 may include a first conductive electrode 1156, a first conductive semiconductor layer 1155 formed with the first conductive electrode 1156, an active layer 1154 formed on the first conductive semiconductor layer 1155, and a second conductive semiconductor layer 1153 formed on the active layer 1154 and a second conductive electrode 1152 formed on the second conductive semiconductor layer 1153.

The first conductive electrode 1156 and first conductive semiconductor layer 1155 may be a p-type electrode and a p-type semiconductor layer, respectively, and the second conductive electrode 1152 and second conductive semiconductor layer 1153 may be an n-type electrode and a n-type semiconductor layer, respectively. However, the embodiment of the invention may not be necessarily limited to this, and may also have an illustration in which the first conductive type is an n-type and the second conductive type is a p-type.

More specifically, the first conductive electrode 1156 is formed on one surface of the first conductive semiconductor layer 1155, and the active layer 1154 is formed between the other surface of the first conductive semiconductor layer 1155 and one surface of the second conductive semiconductor layer 1153, and the second conductive electrode 1152 is formed on the second conductive semiconductor layer 1153.

Furthermore, the first conductive electrode 1156 and the second conductive electrode 1152 are formed to have a height difference from each other, respectively, at positions separated in one direction (or a first direction) in a direction (or a second direction) perpendicular to said one direction. Here, one direction may be a width direction of the semiconductor light emitting device, and a direction perpendicular to said one direction may be a thickness direction of the semiconductor light emitting device.

The second conductive electrode 1152 is formed on the second conductive semiconductor layer 1153 using the height difference, but disposed adjacent to the second electrode 1040 located at an upper side of the semiconductor light emitting device. For example, at least part of the second conductive electrode 1152 is protruded from (or protrudes beyond) a lateral surface of the second conductive semiconductor layer 1153 in said one direction. In this manner, the second conductive electrode 1152 is protruded from (or protrudes beyond) the lateral surface thereof, and thus the second conductive electrode 1152 may be exposed on the semiconductor light emitting device. Through this, the second conductive electrode 1152 is disposed at a position directly in contact with the second electrode 1040 disposed on the conductive adhesive layer 1030.

As illustrated in the drawing, a recess portion 1153a recessed toward the other surface of the second conductive semiconductor layer 1153 may be formed on the one surface of the second conductive semiconductor layer 1153, and the second conductive electrode 1152 may be accommodated into the recess portion 1153a. In this instance, the recess portion 1153a may be formed at an edge of the second conductive semiconductor layer 1153.

The recess portion 1153a may be formed on at least part of a portion which is not covered by the active layer 1154 on one surface of the second conductive semiconductor layer 1153.

As the recess portion 1153a is formed as described above, the second conductive electrode 1152 may be located at a position higher than that of when the second conductive electrode 1152 has no recess portion. Furthermore, as the second conductive electrode 1152 is accommodated into the recess portion 1153a, a lower surface of the second conductive electrode 1152 may be coplanar with the one surface of the second conductive semiconductor layer 1153. Namely, the lower surface of the second conductive electrode 1152 forms the same plane as the one surface of the second conductive semiconductor layer 1153.

According to the drawing, at least part of the second conductive electrode 1152 is embedded in the conductive adhesive layer 1030. For an example, the entire portion of the second conductive electrode 1152 may be embedded in the conductive adhesive layer 1030. Though the second conductive electrode 1152 is embedded in the conductive adhesive layer 1030, the second conductive electrode 1152 forms a structure which is not conducted to the conductive adhesive layer 1030. For the second conductive electrode 1152, the second conductive electrode 1152 is located at an upper side by means of the second conductive semiconductor layer 1153 because the size of a conductive ball disposed at a lower side of the conductive adhesive layer 1030 is formed with a size to the extent that cannot be brought into contact with the second conductive electrode 1152. In other words, a height difference between conductive electrodes corresponding to "P" and "N", respectively, and a resin of the conductive adhesive layer 1030 perform the role of an insulator, and thus a short does not occur.

Furthermore, an upper surface of a portion protruded from a lateral surface of the second conductive semiconductor layer 1153 on the second conductive electrode 1152 has a height difference from the other surface of the second conductive semiconductor layer 1153. A groove 1031 is formed on the conductive adhesive layer 1030 due to the height difference. The groove 1031 may be a place on which an absorption layer (or buffer layer) for absorbing UV is formed during the fabrication process of the display device. The absorption layer (or buffer layer) may be used as a buffer layer for separating an electrode from sapphire or substrate during laser-lift-off, and the thickness thereof has a not so large size in the unit of Angstrom. The fabrication process of using such an absorption layer (or buffer layer) will be described below.

In embodiments of the invention, the second conductive electrode 1152 protrudes from (or protrudes beyond) the lateral surface of the second conductive semiconductor layer 1153 in said one direction while the second conductive electrode 1152 is accommodated into the recess portion 1153a, so that a portion of the second conductive electrode 1152 covers a portion the lateral surface of the second conductive semiconductor layer 1153. In various embodiments of the invention, the second conductive electrode 1152 may be formed to cover none, some, or all of the lateral surface of the second conductive semiconductor layer 1153. When the second conductive electrode 1152 is formed to cover none or some of the lateral surface of the second conductive semiconductor layer 1153, there is a height difference between the second conductive electrode 1152 and the second conductive semiconductor layer 1153. When the second conductive electrode 1152 is formed to cover all of the lateral surface of the second conductive semiconductor layer 1153, there may not be a height difference between the second conductive electrode 1152 and the second conductive semiconductor layer 1153 if upper surfaces of the second conductive electrode 1152 and the second conductive semiconductor layer 1153 are coplanar, but there may be a height difference if the second conductive electrode 1152 protrudes beyond the upper surface of the second conductive semiconductor layer 1153.

At least part of the second electrode 1040 may be formed to fill in the groove 1031 formed on the conductive adhesive layer 1030. To this end, the second electrode 1040 is formed with a shape in which protrusions and recesses are repeated on a lower surface thereof. Through this, the second electrode 1040 may have a structure in which any one portion thereof is inserted into the conductive adhesive layer 1030, and another portion thereof is disposed at an outside of the conductive adhesive layer 1030.

Furthermore, according to the embodiment of the invention, a plurality of semiconductor light emitting devices 1050 may be formed to share a single second conductive electrode 1152 within a sub-pixel. Referring to FIG. 11B, a blue semiconductor light emitting device 1051a on which a red phosphor 1081 is deposited along the arrangement direction of the second electrode 1040, a blue semiconductor light emitting device 1051b on which a green phosphor 1082 deposited, and a blue semiconductor light emitting device 1051c on which phosphor is not deposited are sequentially disposed. In this instance, respective second conductive electrodes 1152 corresponding to blue semiconductor light emitting devices 1051a, 1051b, 1051c within a sub-pixel are electrically connected to one another. In other words, a single second conductive electrode 1152a is formed such that the second conductive electrodes 1152 of the semiconductor light emitting devices adjacent to one another within the sub-pixel are connected to one another. For example, the single second conductive electrode 1152a is formed in a single bar shape within the sub-pixel.

Referring to FIG. 10, the single second conductive electrode 1152a is provided for each sub-pixel, and exposed to the side of N-GaN of the semiconductor light emitting device when the sapphire substrate is separated therefrom during the fabrication process. Accordingly, a printed electrode may be immediately coated on the second conductive electrode 1152 with no etching or vacuum process for ohmic contact, thereby allowing the printed electrode to be the second electrode 1040.

The flip chip type semiconductor light emitting device having the foregoing new structure may implement a flexible display device with fine pitch or a simple fabrication process.

In the above, it has been described a case where the display device includes a blue semiconductor light emitting device that emits blue (B) light, but the embodiment of the invention may not be necessarily limited to this, and another structure for implementing blue, green and red may be also applicable thereto.

Figure 13A:
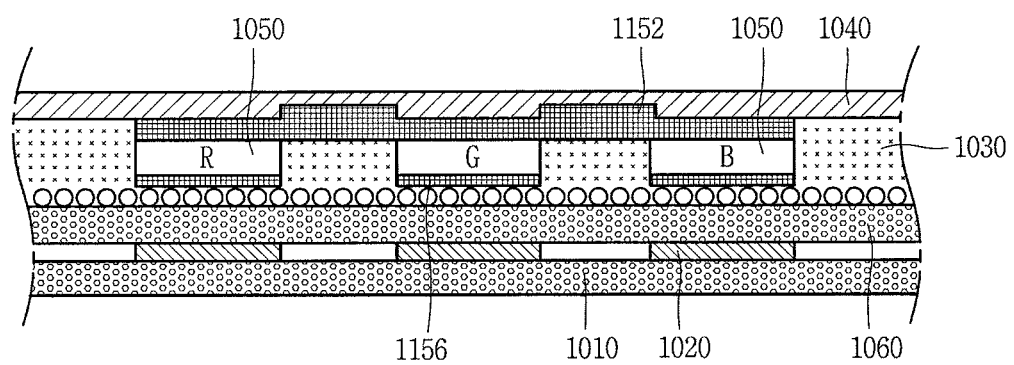
FIGS. 13A through 13C are conceptual views illustrating various forms for implementing color associated with a flip chip type semiconductor light emitting device with a new structure.
Figure 13B:
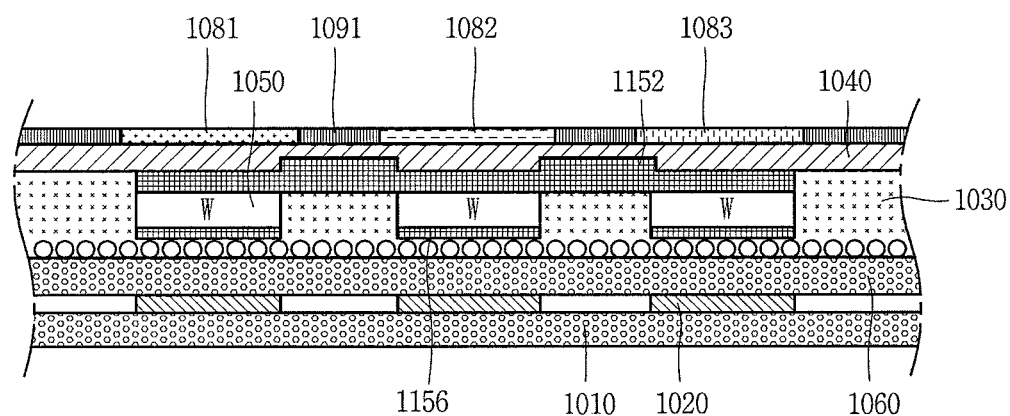
Figure 13C:
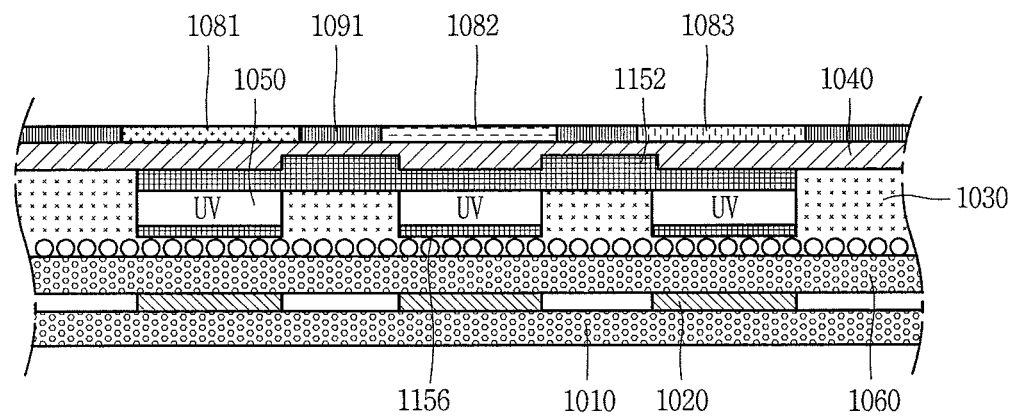

FIGS. 13A through 13C are conceptual views illustrating various forms for implementing color associated with a flip chip type semiconductor light emitting device with a new structure.

Referring to FIG. 13A, each semiconductor light emitting device 1050 may be implemented as a high power light emitting device that emits various light in addition to blue in which gallium nitride (GaN) is mostly used, and indium (In) and/or aluminum (Al) are additionally used.

In this instance, the semiconductor light emitting device 1050 may be red, green and blue semiconductor light emitting devices to implement each sub-pixels, respectively. For instance, red, green and blue semiconductor light emitting devices (R, G, B) are alternately disposed, and red, green and blue sub-pixels form one pixel, thereby implementing a full-color display.

Similarly to the foregoing description, according to the above structure, semiconductor light emitting devices may include a first conductive electrode 1156 and a second conductive electrode 1152 having a height difference from each other. Furthermore, second conductive electrodes 1152 corresponding to the red, green and blue semiconductor light emitting devices (R, G, B), respectively, are electrically connected to one another. In this manner, the red, green and blue semiconductor light emitting devices (R, G, B) may achieve semiconductor light emitting devices with a new structure described with reference to FIGS. 10, 11A and 11B, respectively. The description of the above structure will be substituted by the earlier description.

The semiconductor light emitting devices may accomplish an array structure with a plurality of columns. Here, semiconductor light emitting devices that emit the same color may be disposed to correspond to the same column. For example, semiconductor light emitting devices may be disposed in several columns along a plurality of lines of the first electrode 1020, wherein each column is configured with semiconductor light emitting devices that emit the same color.

In this manner, an additional phosphor layer may not be provided when the semiconductor light emitting devices independently implement R, G and B. Meanwhile, even in this instance, a display device may further include a black matrix 1091 disposed between a plurality of columns configured with semiconductor light emitting devices. As illustrated in the drawing, the black matrix 1091 may be disposed to be separated from each other in a horizontal direction.

For another example, referring to FIG. 13B, the semiconductor light emitting device may include a white light emitting device (W) in which a yellow phosphor layer is provided for each device. In this instance, a phosphor layer may be formed on an upper surface of the white light emitting device (W). Furthermore, in order to accomplish a sub-pixel, a red phosphor layer 1081, a green phosphor layer 1082 and a blue phosphor layer 1083 may be provided on the white light emitting device (W).

Furthermore, the sub-pixel may be carried out using a color filter in which red, green and blue are repeated on the white light emitting device (W). Even in such a structure, similarly to the foregoing description, the white light emitting devices (W) may include a first conductive electrode 1156 and a second conductive electrode 1152 having a height difference from each other. In this manner, the white light emitting devices (W) may implement a semiconductor light emitting device with a new structure described with reference to FIGS. 10, 11A and 11B, respectively. The description of the foregoing structure will be substituted by the earlier description.

On the other hand, even in this instance, a display unit 1000a may further include a black matrix 1091 disposed between a plurality of columns configured with semiconductor light emitting devices for contrast and external reflection enhancement. The black matrix 1091 may be disposed between the red phosphor layer 1081, green phosphor layer 1082 and blue phosphor layer 1083.

For still another example, referring to FIG. 13C, it may have a structure in which the red phosphor layer 1081, green phosphor layer 1082 and blue phosphor layer 1083 are provided on the ultraviolet emitting device (UV). In this manner, the semiconductor light emitting device may be used for the entire region including visible light as well as ultraviolet (UV), and may be extended to the form of a semiconductor light emitting device in which ultraviolet (UV) can be used as an excitation source of the upper phosphor.

Referring to the present illustration again, the semiconductor light emitting device 1050 is located on the conductive adhesive layer 1030 to constitute a sub-pixel in a display device. The semiconductor light emitting device 1050 has an excellent luminance, and thus individual sub-pixels may be configured even with a small size. The semiconductor light emitting device 1050 may have a size of less than 80 μm in the length of one side thereof, and may be a rectangular or square device. In case of a rectangular shape, the semiconductor light emitting device 1050 may have a size less than 20×80 μm.

Even in the above structure, similarly to the foregoing description, ultraviolet light emitting devices (UVs) may include a first conductive electrode 1156 and a second conductive electrode 1152 having a height difference from each other. In this manner, the ultraviolet light emitting devices (UVs) may implement a semiconductor light emitting device with a new structure described with reference to FIGS. 10, 11A and 11B, respectively. The description of the foregoing structure will be substituted by the earlier description.

Furthermore, even when the semiconductor light emitting device 1050 with a square having a size of 10 μm in the length of one side is used as a sub-pixel, it may achieve sufficient brightness for implementing a display device. Accordingly, when the size of a sub-pixel is 600 μm in the length of one side, and 300 μm in the length of the other side, for example, a distance between semiconductor light emitting devices relatively becomes sufficient large. Accordingly, in this instance, it may be possible to implement a flexible display device having an HD quality.

On the other hand, even in this instance, the display device may further include a black matrix 1091 disposed between a plurality of columns configured with semiconductor light emitting devices for contrast enhancement and external reflection. The black matrix 1091 may be disposed between the red phosphor layer 1081, green phosphor layer 1082, and blue phosphor layer 1083.

A display device using the foregoing semiconductor light emitting device will be fabricated by a new type of fabrication method. Hereinafter, the fabrication method will be described with reference to FIGS. 14A and 14B.

Figure 14A:
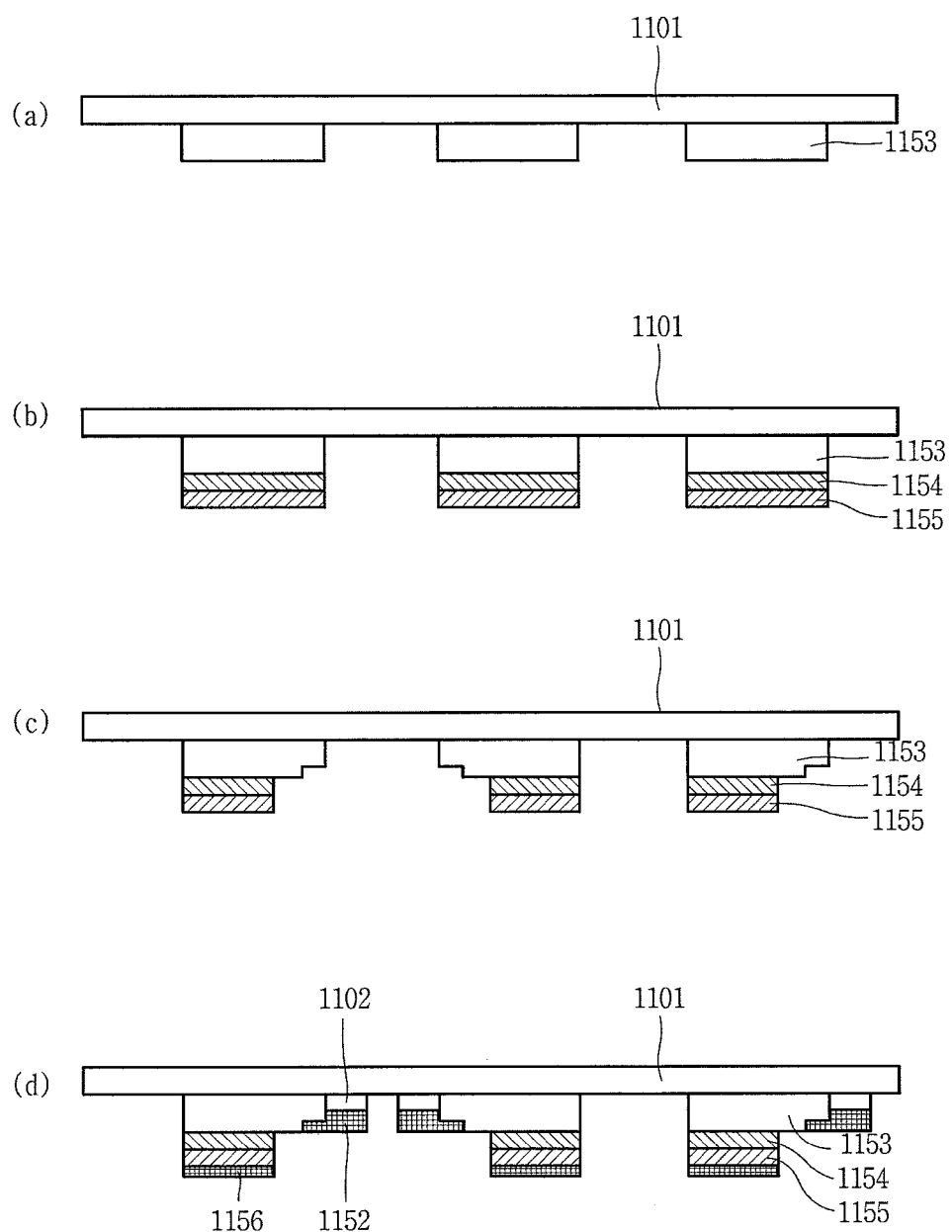
FIGS. 14A and 14B are cross-sectional views illustrating a method of fabricating a display device using a flip chip type semiconductor light emitting device with a new structure according to the embodiment of the invention.
Figure 14B:
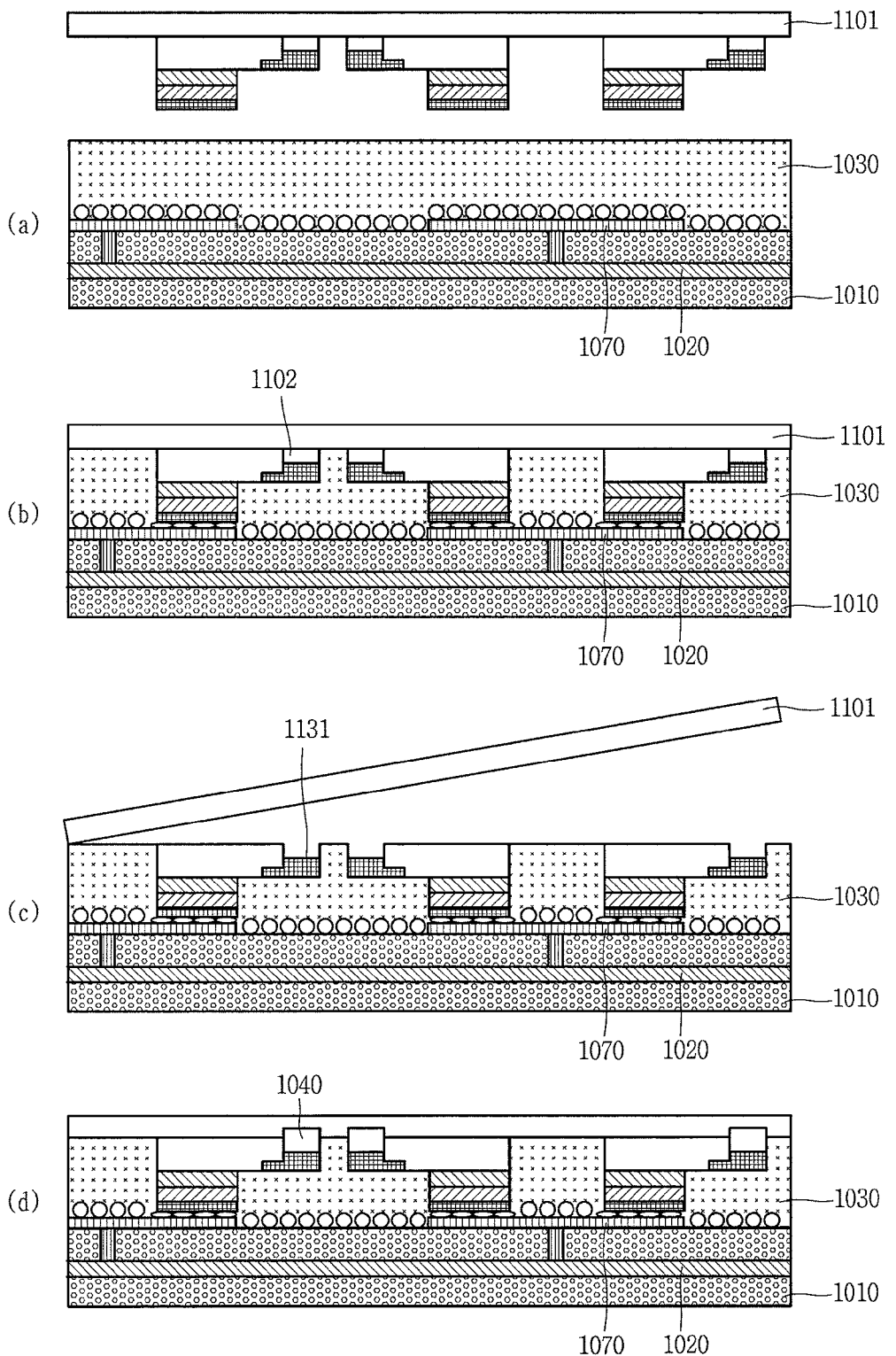

FIGS. 14A and 14B are cross-sectional views illustrating a method of fabricating a display device using a flip chip type semiconductor light emitting device with a new structure according to the embodiment of the invention.

First, according to the fabrication method, a first conductive semiconductor layer 1155 is grown on a growth substrate 1101 ((a) of FIG. 14A).

The growth substrate 1101 including a material having a light-transmitting property, for example, any one of sapphire (Al$_2$O$_3$), GaN, ZnO and AlO, may be formed, but may not be necessarily limited to this. Furthermore, the growth substrate 1101 may be formed of a material suitable to semiconductor material growth, carrier wafer. The growth substrate 1101 may be formed of a material having an excellent thermal conductivity, including a conductive substrate or insulating substrate, for example, an SiC substrate having a thermal conductivity higher than that of the sapphire (Al$_2$O$_3$) substrate or at least one of Si, GaAs, GaP, InP, and Ga$_2$O$_3$.

When the first conductive semiconductor layer 1155 is grown, the active layer 1154 is subsequently deposited on the first conductive semiconductor layer 1155, and the second conductive semiconductor layer 1153 is deposited on the active layer 1154 ((b) of FIG. 14A), Furthermore, at least part of the first conductive semiconductor layer 1155, the active layer 1154 and the second conductive semiconductor layer 1153 is removed to expose at least part of the second conductive semiconductor layer 1153 and form a groove on the second conductive semiconductor layer 1153 ((c) of FIG. 14A).

In this instance, part of the first conductive semiconductor layer 1155 and active layer 1154 is removed in a vertical direction to externally expose the second conductive semiconductor layer 1153. As illustrated in the drawing, the second conductive semiconductor layer 1153 is removed to further recess at least part of a surface externally exposed from the second conductive semiconductor layer 1153 than that of the active layer 1154.

Next, the first conductive electrode 1156 and second conductive electrode 1152 having a height difference in a thickness direction of the conductive adhesive layer 1030 are formed on the first conductive semiconductor layer 1155 and the second conductive semiconductor layer 1153, respectively to implement a flip chip type semiconductor light emitting device ((d) of FIG. 14A). The first conductive electrode 1156 and second conductive electrode 1152 may be formed using a deposition method such as sputtering or the like, but the embodiment of the invention may not be necessarily limited to this.

In this instance, an absorption layer 1102 for absorbing UV laser is formed on an upper surface of a portion protruded from a lateral surface of the second conductive semiconductor layer 1153.

The absorption layer 1102 may be a buffer layer, and formed at a low temperature atmosphere, and formed of a material for alleviating a lattice constant between the semiconductor layer and growth substrate 1101. the absorption layer 1102 may include a material such as GaN, InN, AlN, AlInN, InGaN, AlGaN, and InAlGaN, but the embodiment of the invention may not be necessarily limited to this. The absorption layer 1102 may be grown on the growth substrate 1101 as a single crystal layer.

As illustrated in the drawing, the first conductive electrode 1156 is formed on one surface of the first conductive semiconductor layer 1155, and the active layer 1154 is formed between the other surface of the first conductive semiconductor layer 1155 and one surface of the second conductive semiconductor layer 1153, and the second conductive electrode 1152 is formed on the second conductive semiconductor layer 1153.

Furthermore, the first conductive electrode 1156 and second conductive electrode 1152 are formed to have a height difference from each other in a direction perpendicular to said one direction at positions separated in said one direction, respectively.

The second conductive electrode 1152 is formed on the second conductive semiconductor layer 1153 using the height difference, but located at an upper side of the semiconductor light emitting device. For example, at least part of the second conductive electrode 1152 is protruded from a lateral surface of the second conductive semiconductor layer 1153. In this manner, since the second conductive electrode 1152 is protruded from the lateral surface, the second conductive electrode 1152 is exposed on the semiconductor light emitting device.

As the second conductive semiconductor layer 1153 is removed to further recess a surface externally exposed from the second conductive semiconductor layer 1153 than that of the active layer 1154, at least part of the second conductive electrode 1152 is disposed at the formed recess portion 1153a.

Next, the flip chip type semiconductor light emitting device is coupled to the conductive adhesive layer 1030 ((b) of FIG. 14B).

For example, a set in which the light emitting device is coupled to the growth substrate is aligned with a wiring electrode disposed at a lower portion of the conductive adhesive layer 1030 ((a) of FIG. 14B), and then heat or a catalyst is applied while pressing it to the conductive adhesive layer 1030.

The conductive adhesive layer 1030 has fluidity due to heat, and the semiconductor light emitting device is embedded in the conductive adhesive layer 1030, and the first conductive electrode 1156 and first electrode 1020 are electrically connected to each other due to a conductive ball or the like within the conductive adhesive layer 1030. Then, the conductive adhesive layer 1030 is cured during the process of dissipating heat.

In this instance, an upper surface of a portion protruded from a lateral surface of the second conductive semiconductor layer 1153 on the second conductive electrode 1152 has a height difference from an upper surface of the second conductive semiconductor layer 1153, and a groove 1031 is formed on the conductive adhesive layer 1030 due to the height difference, and the absorption layer 1102 may be formed on the groove 1031.

Next, when the conductive adhesive layer 1030 is cured, the growth substrate 1101 and absorption layer 1102 are removed (14B(c)). A laser lift off (LLO) method may be used for the removal method of the growth substrate. However, the embodiment of the invention may not be necessarily limited to this, and for another example, a wet etching, a dry etching or a laser lift off (LLO) method may be used.

Finally, the second electrode 1040 is printed (coated) to cover the second conductive electrode on an upper surface of the conductive adhesive layer ((d) of FIG. 14B). As described above, the second electrode 1040 is exposed to the side of N-GaN of the semiconductor light emitting device when the sapphire substrate is separated therefrom during the fabrication process. Accordingly, a printed electrode may be immediately formed on the second conductive electrode with no vacuum process for ohmic contact.

Figure 15:
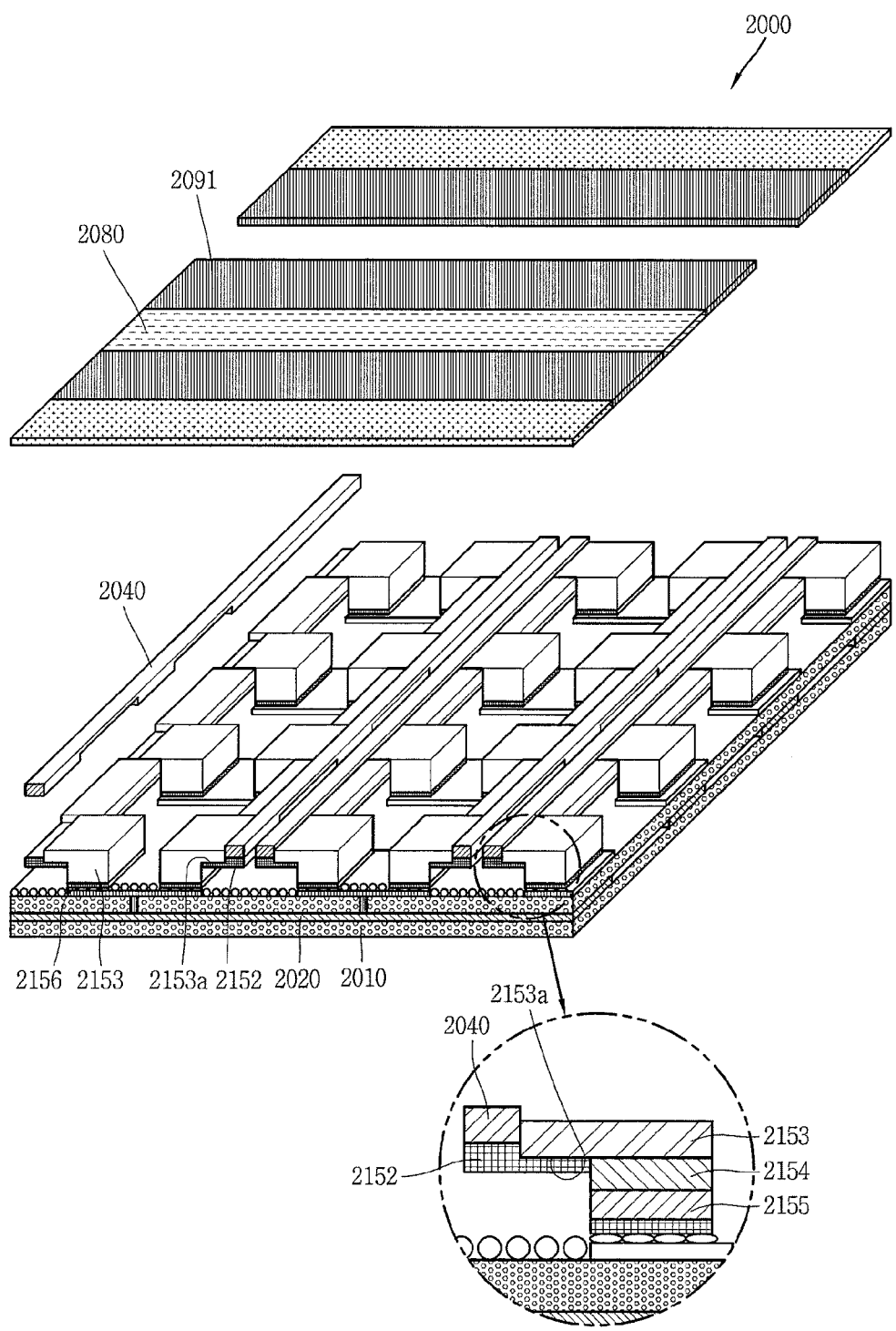
FIG. 15 is a partially enlarged view illustrating a display device to which a semiconductor light emitting device with a new structure is applied according to another embodiment of the invention.

FIG. 15 is a partially enlarged view illustrating a display device to which a semiconductor light emitting device with a new structure is applied according to another embodiment of the invention. Hereinafter, unless otherwise stated, according to the structure of the present illustration, the content described with reference to FIGS. 10, 11A and 11B will be applicable to a display device to which a new type flip chip type semiconductor light emitting device is applied.

According to the drawing, the first conductive electrode 2156 is formed on one surface of the first conductive semiconductor layer 2155, and the active layer 2154 is formed between the other surface of the first conductive semiconductor layer 2155 and one surface of the second conductive semiconductor layer 2153, and the second conductive electrode 2152 is formed on the second conductive semiconductor layer 2153.

Furthermore, the first conductive electrode 2156 and the second conductive electrode 2152 are formed to have a height difference from each other, respectively, at positions separated in one direction in a direction perpendicular to said one direction. Here, one direction may be a width direction of the semiconductor light emitting device, and a direction perpendicular to said one direction may be a thickness direction of the semiconductor light emitting device.

The second conductive electrode 2152 is formed on the second conductive semiconductor layer 2153 using the height difference, but disposed adjacent to the second electrode 2040 located at an upper side of the semiconductor light emitting device. For example, at least part of the second conductive electrode 2152 is protruded from a lateral surface of the second conductive semiconductor layer 2153 in said one direction. In this manner, the second conductive electrode 2152 is protruded from the lateral surface thereof, and thus the second conductive electrode 2152 may be exposed on the semiconductor light emitting device. Through this, the second conductive electrode 2152 is disposed at a position directly in contact with the second electrode 2040 disposed on the conductive adhesive layer 2030.

As illustrated in the drawing, a recess portion 2153a recessed toward one surface of the second conductive semiconductor layer 2153 may be formed on the other surface of the second conductive semiconductor layer 2153, and the second conductive electrode 2152 may be formed on the recess portion 2153a. In this instance, a portion which is not covered by the active layer 2154 is recessed as a whole on one surface of the second conductive semiconductor layer 2153. Accordingly, a portion which is covered by the active layer 2154 and a portion which is not covered thereby have a height difference from each other on the second conductive semiconductor layer 2153.

The second conductive electrode 2152 is disposed at the non-covered portion, and the second conductive electrode 1152 may be located at a position higher than that of when the second conductive electrode has no recess portion.

Furthermore, according to the drawing, at least part of the second conductive electrode 2152 is embedded in the conductive adhesive layer 2030. For an example, the entire portion of the second conductive electrode 2152 may be embedded in the conductive adhesive layer 2030.

At least part of the second electrode 2040 may be formed to fill in the groove 2031 formed on the conductive adhesive layer 2030. To this end, the second electrode 2040 is formed with a shape in which protrusions and recesses are repeated on a lower surface thereof. Through this, the second electrode 2040 may have a structure in which any one portion thereof is inserted into the conductive adhesive layer 2030, and another portion thereof is disposed at an outside of the conductive adhesive layer 2030.

Furthermore, according to the embodiment of the invention, a plurality of semiconductor light emitting devices 1050 are electrically connected to one another within a sub-pixel as well as forms an electrical connection structure between the sub-pixels. In other words, the second conductive electrodes 2152 are connected to each other between the sub-pixels with no disconnection. In this manner, the second conductive electrode 2152 is formed as the adjoining semiconductor light emitting devices are connected to one another along the second electrode. Accordingly, the second conductive electrode 2152 having a shape in which a plurality of the adjoining sub-pixels are connected to one another similarly to that of the second electrode 2040 is formed in a elongated bar shape.

A display device to which a new type flip chip type semiconductor light emitting device according to the embodiment of the invention is applied may be modified in various forms as shown in the above structure.

The configurations and methods according to the above-described embodiments will not be applicable in a limited way to the foregoing display device using a semiconductor light emitting device, and all or part of each embodiment may be selectively combined and configured to make various modifications thereto.

What is claimed is:
1. A display device, comprising:
a wiring substrate disposed with a first electrode;
a conductive adhesive layer disposed between the wiring substrate and a second electrode; and
a plurality of semiconductor light emitting devices coupled to the conductive adhesive layer, and electrically connected to the first electrode and the second electrode,
wherein at least one of the plurality of semiconductor light emitting devices comprises a first conductive electrode and a second conductive electrode disposed to be separated from each other, the at least one of the semiconductor light emitting devices having a lateral surface, and wherein the second conductive electrode extends beyond the lateral surface of the at least one of semiconductor light emitting devices.

2. The display device of claim 1, wherein each of the plurality of semiconductor light emitting devices emits at least one of red light, green light, blue light and ultraviolet light.

3. The display device of claim 1, further comprising a phosphor layer to convert a predetermined light into at least one of red light, green light and blue light.

4. The display device of claim 1, wherein the first conductive electrode and second conductive electrode are separated from each other in a first direction and have a height difference from each other in a second direction perpendicular to the first direction to be electrically connected to the first electrode and the second electrode, respectively, at positions separated in the first direction, wherein the at least one of the plurality of semiconductor light emitting devices further comprises a first conductive semiconductor layer, a second conductive semiconductor layer and an active layer, respectively, and the first conductive electrode is formed on one surface of the first conductive semiconductor layer, and the active layer is formed between the other surface of the first conductive semiconductor layer and one surface of the second conductive semiconductor layer, and the second conductive electrode is formed on the second conductive semiconductor layer and disposed adjacent to the second electrode due to the height difference.

5. The display device of claim 4, wherein the second conductive semiconductor layer has a recess portion formed in a surface of the second conductive semiconductor layer that is closest to the wiring substrate, and a portion of the second conductive electrode is accommodated into the recess portion.

6. The display device of claim 5, wherein the recess portion is formed at an edge of the second conductive semiconductor layer.

7. The display device of claim 4, wherein, as the second conductive electrode is accommodated into the recess portion, a lower surface of the second conductive electrode is coplanar with the one surface of the second conductive semiconductor layer.

8. The display device of claim 1, wherein the at least one of the plurality of semiconductor light emitting devices further comprises a first conductive semiconductor layer, a second conductive semiconductor layer and an active layer, respectively, that are stacked in one direction, and wherein at least part of the second conductive electrode is protruded from the lateral surface of the second conductive semiconductor layer along another direction that is perpendicular to the one direction.

9. The display device of claim 8, wherein the second electrode is electrically connected to a surface of a protruded portion of the second conductive electrode that extends beyond the lateral surface of the second conductive semiconductor layer.

10. The display device of claim 9, wherein the second conductive electrode has an upper surface most distal from the wiring substrate, and the second electrode is electrically connected to the upper surface.

11. The display device of claim 10, wherein the surface of the protruded portion of the second conductive electrode has a height difference from another surface of the second conductive semiconductor layer that is most distal from the wiring substrate.

12. The display device of claim 8, wherein at least part of the second conductive electrode is embedded in the conductive adhesive layer.

13. The display device of claim 1, wherein two or more of the plurality of semiconductor light emitting devices share a single second conductive electrode within a sub-pixel.

14. The display device of claim 13, wherein the single second conductive electrode is formed by adjoined second conductive electrodes of the semiconductor light emitting devices within the sub-pixel that are connected to one another.

15. The display device of claim 1, wherein the plurality of semiconductor light emitting devices are flip chip type light emitting devices.

* * * * *